United States Patent
Kawanaka

(10) Patent No.: US 9,864,013 B2
(45) Date of Patent: Jan. 9, 2018

(54) DETERIORATION DETECTING APPARATUS AND DETERIORATION DETECTING METHOD

(71) Applicant: FUJITSU TEN LIMITED, Kobe-shi, Hyogo (JP)

(72) Inventor: Shota Kawanaka, Kobe (JP)

(73) Assignee: FUJITSU TEN LIMITED, Kobe-shi, Hyogo (JP)

( * ) Notice: Subject to any disclaimer, the term of this patent is extended or adjusted under 35 U.S.C. 154(b) by 10 days.

(21) Appl. No.: 15/053,242

(22) Filed: Feb. 25, 2016

(65) Prior Publication Data

US 2016/0252587 A1 Sep. 1, 2016

(30) Foreign Application Priority Data

Feb. 27, 2015 (JP) ................. 2015-039511

(51) Int. Cl.
*G01R 31/36* (2006.01)
*G01R 27/02* (2006.01)
*G01R 31/02* (2006.01)

(52) U.S. Cl.
CPC ....... *G01R 31/3627* (2013.01); *G01R 27/025* (2013.01); *G01R 31/028* (2013.01)

(58) Field of Classification Search
CPC combination set(s) only.
See application file for complete search history.

(56) References Cited

U.S. PATENT DOCUMENTS

| | | | |
|---|---|---|---|
| 2011/0084705 A1* | 4/2011 | Kawamura | G01R 27/025 324/551 |
| 2012/0153966 A1* | 6/2012 | Kawamura | G01R 31/028 324/548 |

FOREIGN PATENT DOCUMENTS

| | | |
|---|---|---|
| JP | 2011-102788 A | 5/2011 |
| JP | 2012-132725 A | 7/2012 |
| JP | 2014-020914 A | 2/2014 |

* cited by examiner

*Primary Examiner* — Clayton E Laballe
*Assistant Examiner* — Jas Sanghera
(74) *Attorney, Agent, or Firm* — Oliff PLC

(57) ABSTRACT

A deterioration detecting apparatus includes: a capacitor that is connected to an insulated electric power source, and is charged and discharged; a voltage detecting unit that detects a voltage of the capacitor; and a deterioration detecting unit that detects a deterioration in an insulating resistor of the electric power source on the basis of the voltage of the capacitor charged through a charging path for detecting a deterioration in the insulating resistor of the electric power source, and the voltage of the capacitor during discharging.

5 Claims, 17 Drawing Sheets

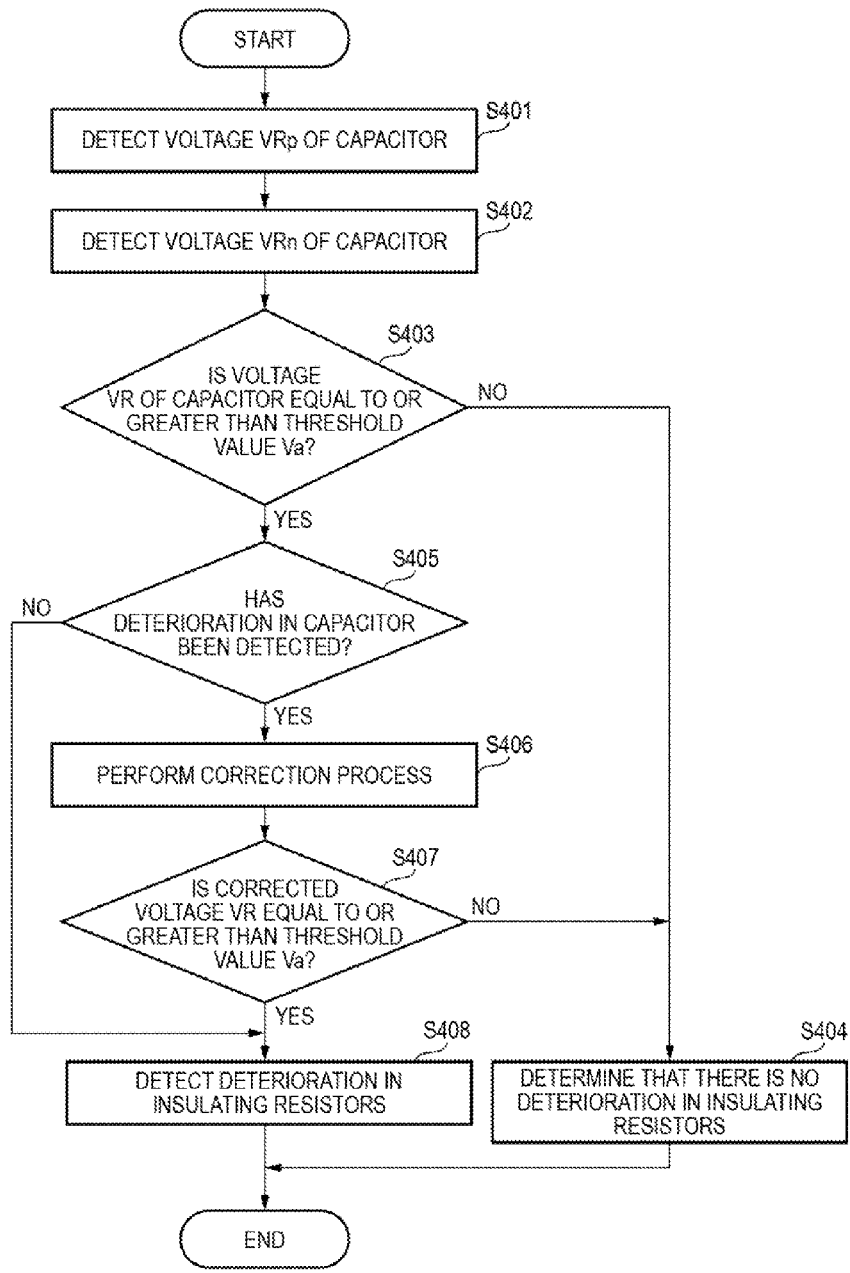

DETERIORATION DETECTING APPARATUS AND DETERIORATION DETECTING METHOD

CROSS REFERENCE TO RELATED APPLICATION

This application is based on and claims priority under 35 USC 119 from Japanese Patent Application No. 2015-039511 filed on Feb. 27, 2015, the entire content of which is incorporated herein by reference.

BACKGROUND

1. Technical Field

The present invention relates to a deterioration detecting apparatus and a deterioration detecting method.

2. Related Art

There is proposed a vehicle such as a hybrid electric vehicle or an electric vehicle includes an electric power source for supplying electric power to a motor which is a power source. The electric power source is configured so as to be insulated from the body of the vehicle. Also, there is known an apparatus for monitoring the insulated state of such an electric power source, in other words, an apparatus for detecting a deterioration in an insulation resistor of an electric power source (see JP-A-2014-20914 for instance).

In the above described technology according to the related art, a deterioration in an insulation resistor of an electric power source is detected by a flying capacitor system. Specifically, in the technology according to the related art, electric power is supplied from the electric power source to a capacitor through an insulating resistor, whereby the capacitor is charged, and on the basis of the voltage of the charged capacitor, a deterioration in the insulation resistor of the electric power source is detected.

SUMMARY OF INVENTION

However, the voltage of the charged capacitor increases or decreases not only in a case where the insulation resistor of the electric power source is deteriorated but also, for example, in a case where the capacitor is deteriorated. Therefore, in the above described technology according to the related art, due to a deterioration in the capacitor or the like, it may be difficult to accurately detect a deterioration in the insulation resistor of the electric power source.

In view of the above, at least one embodiment of the present invention is to provide a deterioration detecting apparatus and a deterioration detecting method capable of improving the accuracy of detection on a deterioration in an insulation resistor of an electric power source.

At least one embodiment of the present invention provides a deterioration detecting apparatus including: a capacitor that is connected to an insulated electric power source, and is charged and discharged; a voltage detecting unit that detects a voltage of the capacitor; and a deterioration detecting unit that detects a deterioration in an insulating resistor of the electric power source on the basis of the voltage of the capacitor charged through a charging path for detecting a deterioration in the insulating resistor of the electric power source, and the voltage of the capacitor during discharging.

According to the at least one embodiment of the present invention, it is possible to improve the accuracy of detection on a deterioration in an insulation resistor of an electric power source.

BRIEF DESCRIPTION OF DRAWINGS

FIG. 18 is a flow chart illustrating the process procedure of an insulation resistor deterioration detecting process according to a modification.

DESCRIPTION OF EMBODIMENTS

Hereinafter, deterioration detecting apparatuses and deterioration detecting methods according to embodiments of the present invention will be described in detail with reference to the accompanying drawings. However, the present invention is not limited to the embodiments to be described below.

(First Embodiment)

<1. Configuration of Charging/Discharging System>

Figure 1:
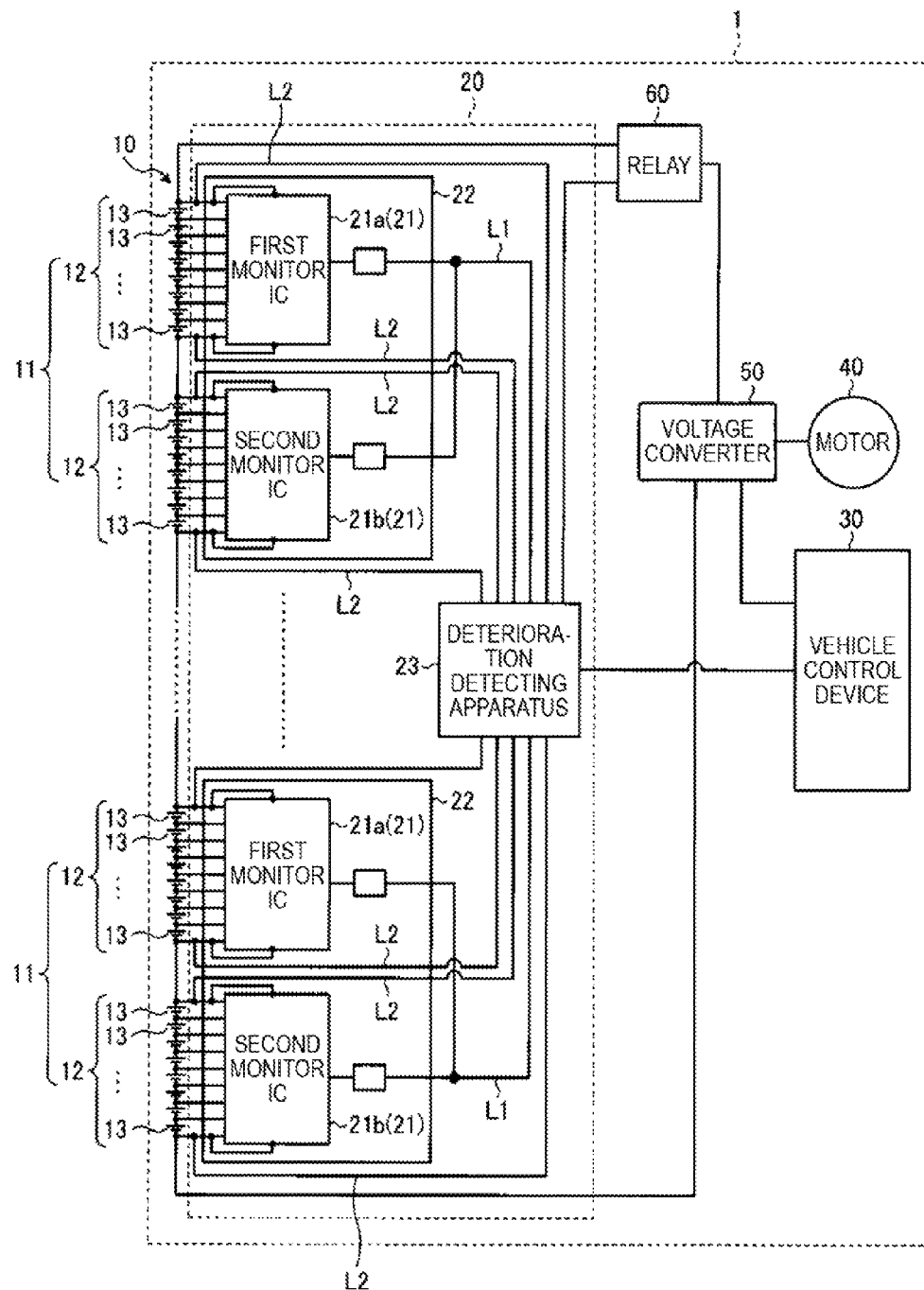
FIG. 1 is a block diagram illustrating an example of the configuration of a charging/discharging system including a deterioration detecting apparatus according to a first embodiment.

FIG. 1 is a block diagram illustrating an example of the configuration of a charging/discharging system including a deterioration detecting apparatus according to a first embodiment. A charging/discharging system 1 is mounted on a vehicle (not shown) such as a hybrid electric vehicle (HEV), an electric vehicle (EV), or a fuel cell vehicle (FCV). The charging/discharging system 1 is a system for performing charging and discharging of an electric power source for supplying electric power to a motor which is the power source of the vehicle.

Specifically, the charging/discharging system 1 includes an assembled battery 10, a battery monitoring system 20, a vehicle control device 30, a motor 40, a voltage converter 50, and a relay 60 for a fail-safe. Also, the battery monitoring system 20 includes a plurality of satellite boards 22 having monitor integrated circuits (ICs) 21 and so on, and a deterioration detecting apparatus 23.

The assembled battery 10 is an electric power source (a battery) which is insulated from the body of the vehicle (not shown), and is configured by a plurality of blocks 11. One block 11 includes a plurality of, for example, two battery stacks 12 connected in series. Also, one battery stack 12 includes, for example a plurality of battery cells 13 connected in series.

However, the number of blocks 11, battery stacks 12, or battery cells 13 is not limited to that described above or shown in the drawings. Also, as the assembled battery 10, for example, a lithium ion secondary battery, a nickel-hydrogen secondary battery, or the like can be used. However, the assembled battery is not limited thereto.

The plurality of battery cells 13 of each battery stack is electrically connected to a corresponding one of the monitor ICs 21 installed on the satellite boards 22. Also, the voltage of each battery cell 13 is detected by a corresponding monitor IC 21. Further, the monitor ICs 21 are composed of first monitor ICs 21a and second monitor ICs 21b, and each of the first and second monitor ICs 21a and 21b detects the voltages of twelve battery cells 13 of a corresponding battery stack 12.

In addition, the number of input channels for the monitor ICs and the number of the monitor ICs is not limited to the numbers described in this embodiment.

The deterioration detecting apparatus 23 detects a deterioration in an insulating resistor (to be described below) of the battery monitoring system 20, and a deterioration in a capacitor (to be described below) or the like for measuring the voltage of the assembled battery 10 serving as an electric power source. This will be described below. Here, a deterioration in an insulating resistor means that the electricity of the assembled battery 10 leaks, for example, due to a decrease in the resistance value of the insulating resistor, and a deterioration in the capacitor or the like means, for example, that the electrostatic capacity of the capacitor becomes a value exceeding an allowable range due to deterioration over time as compared to an initial value.

Also, the deterioration detecting apparatus 23 has a function of monitoring the voltage of each of the battery stacks 12 while monitoring the voltage of each of the battery cells 13. In other words, the deterioration detecting apparatus 23 monitors the charged state of the assembled battery 10.

Specifically, the deterioration detecting apparatus 23 transmits a voltage detection request to the monitor ICs 21, thereby performing control such that the monitor ICs detect the voltages of the battery cells 13, respectively, and receives the detection results through communication lines L1. In this way, the deterioration detecting apparatus monitors the voltages of the battery cells 13. Also, the deterioration detecting apparatus 23 changes capacitors (to be described below) with the voltages of the battery stacks 12 (hereinafter, referred to as the "stack voltages") through conductive wires L2, thereby directly measuring the stack voltages. In this way, the deterioration detecting apparatus monitors the charged state of the assembled battery 10.

Also, it is preferable that the deterioration detecting apparatus 23 should have a function of determining whether the monitor ICs 21 are normally operating. Specifically, for example, the deterioration detecting apparatus 23 adds the voltages of the battery cells 13 received from each monitor IC 21, thereby obtaining a stack voltage, and compares the stack voltage with a directly detected stack voltage. If the difference between them is larger than an allowable value, the deterioration detecting apparatus determines that the corresponding monitor IC 21 is abnormal. In a case where it is determined that a monitor IC 21 is abnormal, for example, the deterioration detecting apparatus 23 may separate the relay 60 for a fail-safe from the corresponding monitor IC such that charging and discharging on corresponding battery cells 13 is not performed.

The vehicle control device 30 performs charging and discharging on the assembled battery 10 according to the charged state of the assembled battery 10, thereby controlling the vehicle. Specifically, the vehicle control device 30 converts the DC voltage of the assembled battery 10 charged into an AC voltage by the voltage converter 50, and supplies the converted voltage to the motor 40, thereby driving the motor 40. As a result, the assembled battery 10 is discharged.

Also, the vehicle control device 30 converts an AC voltage generated by regenerative braking of the motor 40, into a DC voltage, by the voltage converter 50, and supplies the DC voltage to the assembled battery 10. As a result, the assembled battery 10 is charged. As described above, the vehicle control device 30 monitors the voltage of the assembled battery 10 on the basis of the charged state of the assembled battery 10 acquired from the deterioration detecting apparatus 23, and performs control according to the monitoring result.

<2. Configuration of Deterioration Detecting Apparatus>

Figure 2:
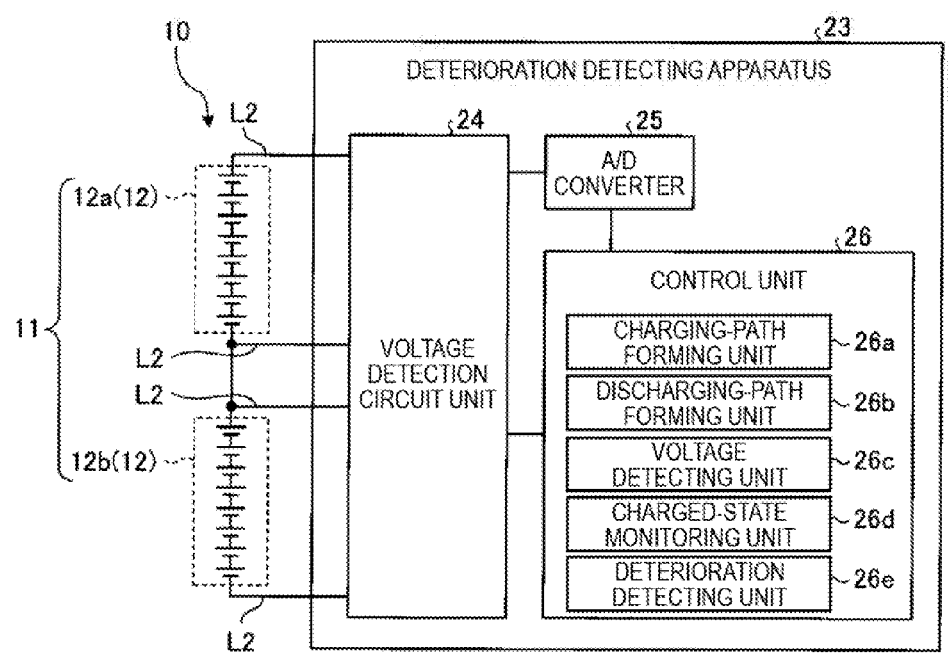
FIG. 2 is a block diagram illustrating an example of the configuration of the deterioration detecting apparatus.

Now, the configuration of the deterioration detecting apparatus 23 will be described. FIG. 2 is a block diagram illustrating an example of the configuration of the deterioration detecting apparatus 23. However, in FIG. 2, some components such as the satellite boards 22 and the communication lines L1 are not shown. Also, for the purpose of easy understanding, one of the plurality of blocks 11 is shown in FIG. 2, and hereinafter, one of two battery stacks 12 of one block 11 will also be referred to as a "first stack 12a", and the other will also be referred to as a "second stack 12b".

The deterioration detecting apparatus 23 is, for example, an electronic control unit (ECU), and includes a voltage detection circuit unit 24, an A/D converter 25, and a control unit 26 as shown in FIG. 2.

The voltage detection circuit unit 24 includes a circuit for performing detection on the voltage of each stack, detection on a deterioration in an insulating resistor, detection on a deterioration in a capacitor, and the like. Now, the voltage detection circuit unit 24 will be described in detail with reference to FIG. 3.

Figure 3:
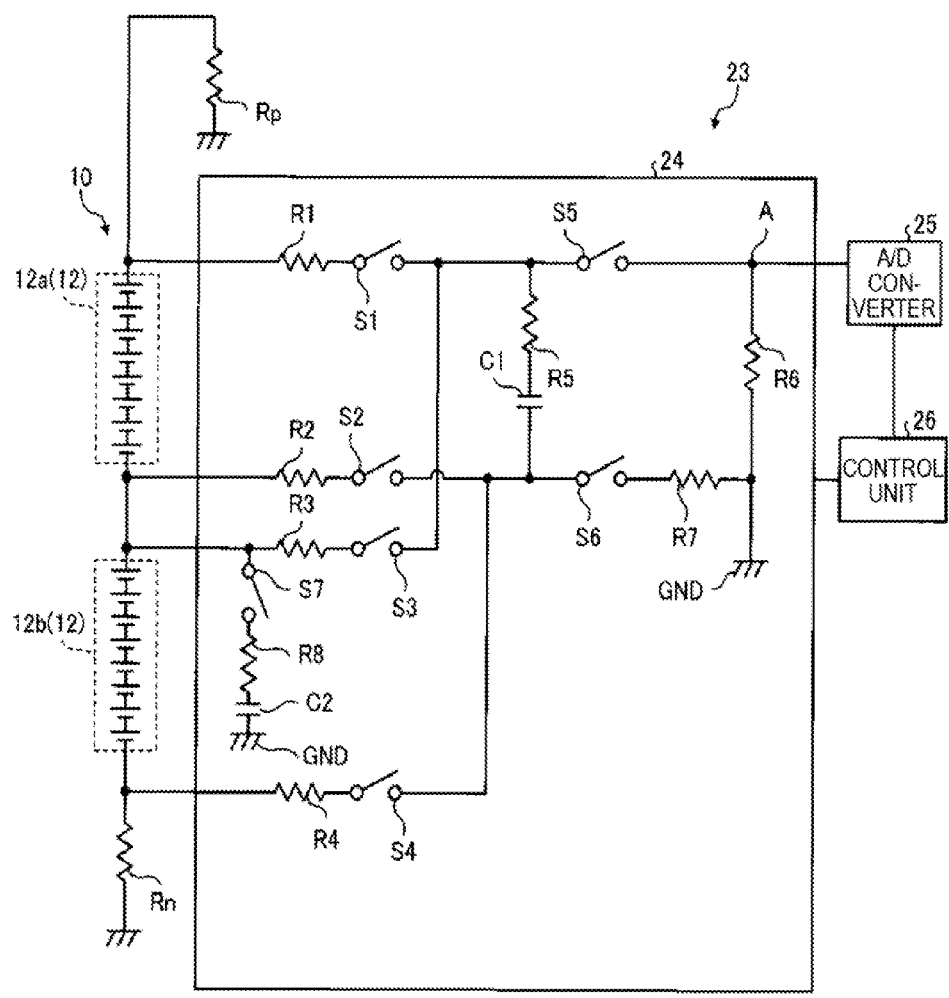
FIG. 3 is a view illustrating an example of the configuration of a voltage detection circuit unit.

FIG. 3 is a view illustrating an example of the configuration of the voltage detection circuit unit 24. As shown in FIG. 3, the voltage detection circuit unit 24 includes a capacitor C1, a first switch Si to a sixth switch S6, a deterioration detection switch S7, a first resistor R1 to a seventh resistor R7, and a deterioration detection resistor R8. Also, to the assembled battery 10, an insulating resistor Rp is connected on the positive electrode side, and an insulating resistor Rn is connected on the negative electrode side.

The voltage detection circuit unit 24 uses a flying capacitor system, and charges the capacitor C1 with the voltage of each of the stacks 12a and 12b, and detects the voltage of the capacitor C1 as the voltage of the corresponding stack 12a or 12b.

Specifically, the voltage detection circuit unit 24 includes a charging circuit and a discharging circuit with the capacitor C1 interposed therebetween. The charging circuit is a portion which is configured by connecting the stacks 12a and 12b of the assembled battery 10 with the capacitor C1 and includes paths for charging the capacitor C1 with the voltage of each stack 12a or 12b. Also, the discharging circuit is a portion including a path for discharging the charged voltage of the capacitor C1.

Further, turning on or off of each of the switches S1 to S6 is controlled, whereby charging and discharging on the capacitor C1 are controlled. Also, as the switches S1 to S6 described above and the deterioration detection switch S7 to be described below, for example, solid state relays (SSRs) can be used. However, those switches are not limited thereto. Also, the first switch S1 to the sixth switch S6 are examples of connection switches. Also, the first resistor R1 to the seventh resistor R7, and the deterioration detection resistor R8 to be described below are voltage detection resistors for detecting the voltage of the capacitor C1.

In the charging circuit of the voltage detection circuit unit 24, each of the first stack 12a and the second stack 12b is connected in parallel with the capacitor C1. In other words, both ends of the capacitor C1 are connected to the positive electrode and the negative electrode of the first stack 12a, and are connected to the positive electrode and the negative electrode of the second stack 12b.

Also, between the positive electrode side of the first stack 12a and the capacitor C1, the first resistor R1, the first switch S1, and the fifth resistor R5 are provided in series, and between the negative electrode side of the first stack 12a and the capacitor C1, the second resistor R2, and the second switch S2 are provided in series.

Also, between the positive electrode side of the second stack 12b and the capacitor C1, the third resistor R3, the third switch S3, and the fifth resistor R5 are, provided in series, and between the negative electrode side of the second stack 12b and the capacitor C1, the fourth resistor R4 and the fourth switch S4 are provided in series.

In the discharging circuit of the voltage detection circuit unit 24, the fifth switch S5 is provided on a path positioned on the positive electrode sides of the first stack 12a and the second stack 12b, and the fifth resistor R5 is provided between one end of the fifth switch S5 and the capacitor C1. Also, the sixth switch S6 is provided on a path positioned on the negative electrode sides of the first and second stacks 12a and 12b, and one end of the sixth switch S6 is connected to the capacitor C1.

Further, the other end of the fifth switch S5 is connected to the A/D converter 25, and is connected to a vehicle body GD through the sixth resistor R6. Also, the other end of the sixth switch S6 is connected to the vehicle body GND through the seventh resistor R7.

The A/D converter 25 converts an analog value representing the voltage on the connection point A with the voltage detection circuit unit 24, into a digital value, and outputs the digital value to the control unit 26.

Figure 4:
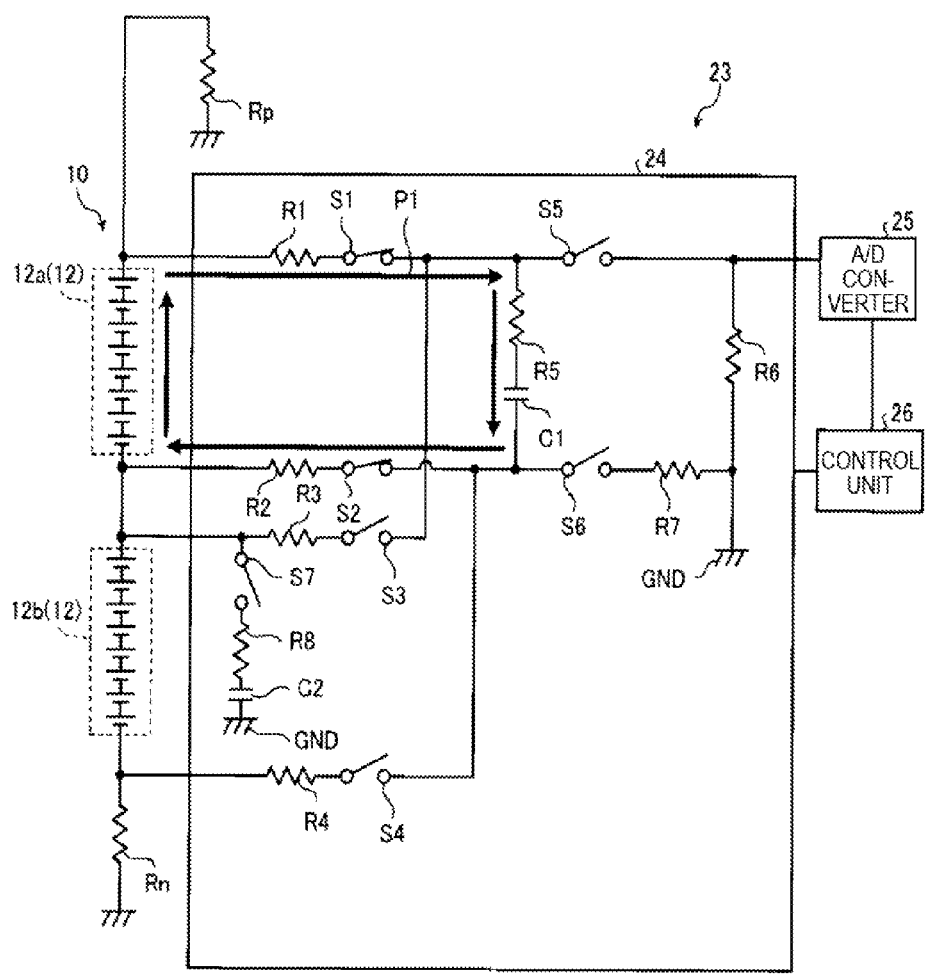
FIG. 4 is a view illustrating a charging path for charging a capacitor with the voltage of a first stack.
Figure 5:
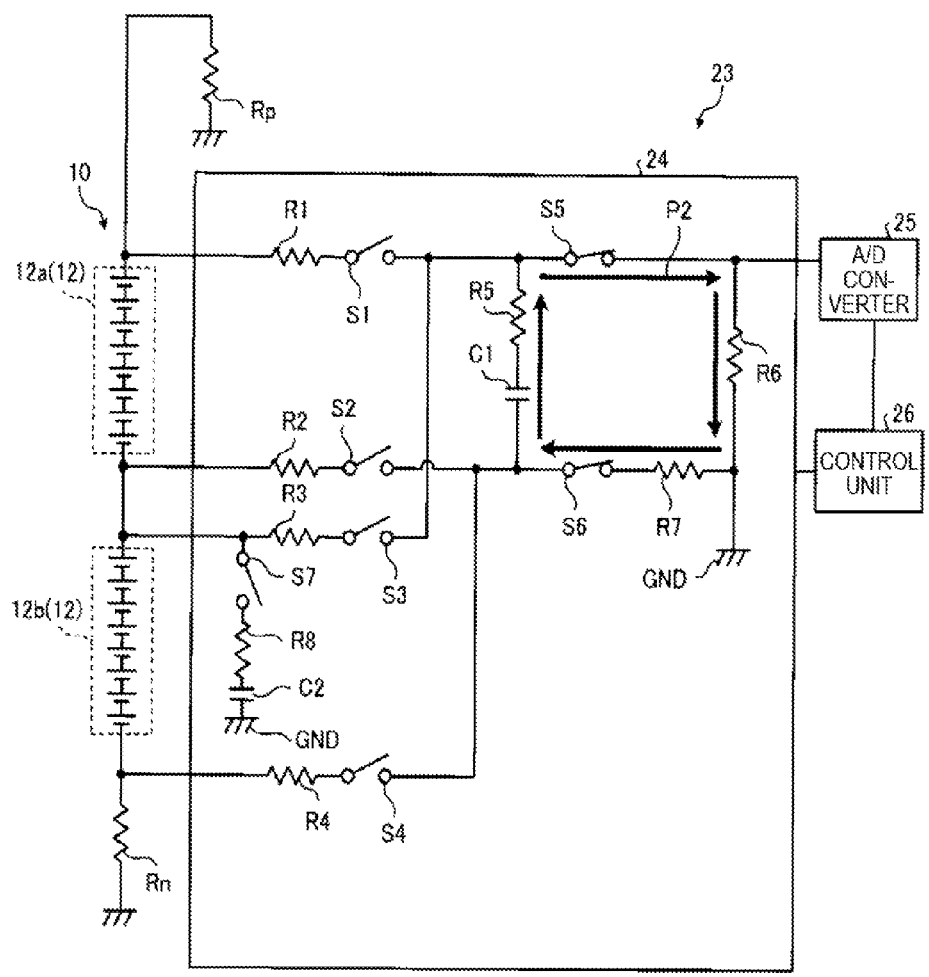
FIG. 5 is a view illustrating a discharging path for discharging the charged capacitor.
Figure 6:
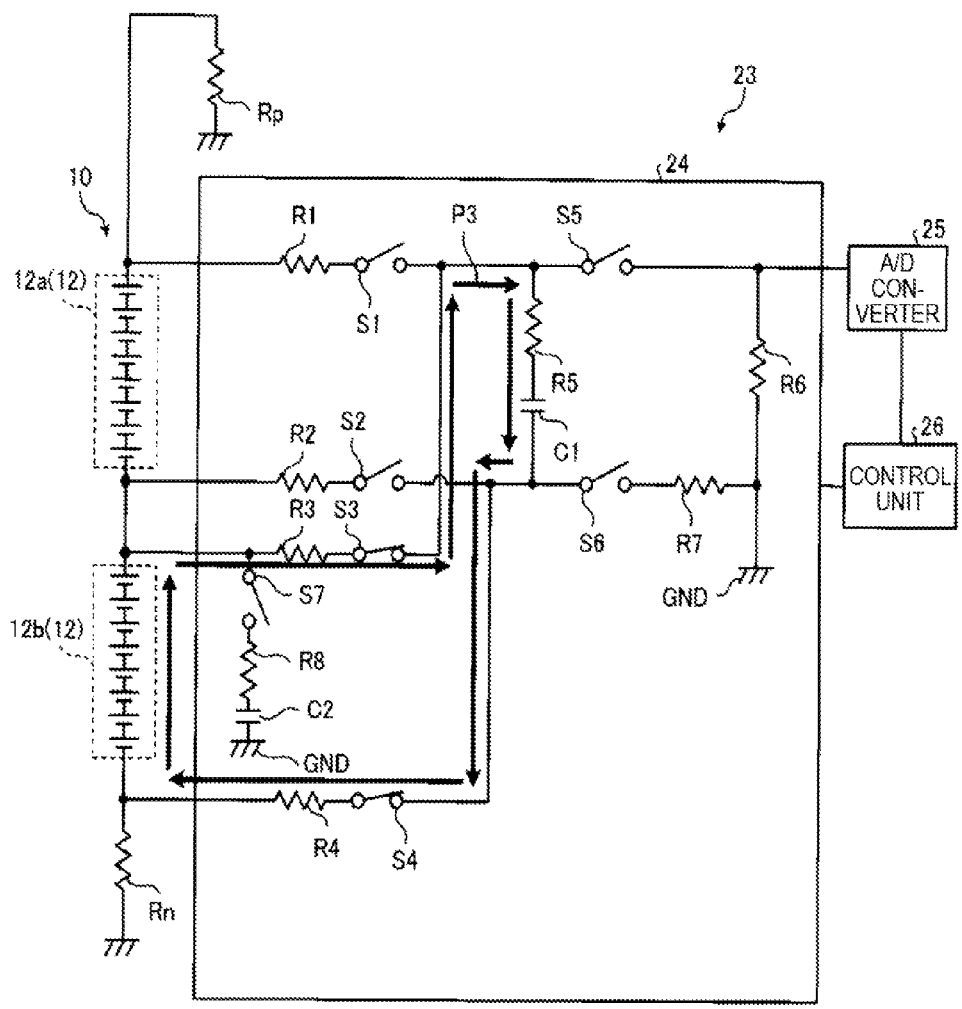
FIG. 6 is a view illustrating a charging path for charging the capacitor with the voltage of a second stack.

Now, charging and discharging of the capacitor C1 which are performed in order to detect the voltages of the first and second stacks 12a and 12b will be described with reference to FIGS. 4 to 6. FIG. 4 is a view illustrating a charging path, for charging the capacitor C1 with the voltage of the first stack 12a. Also, FIG. 5 is a view illustrating a discharging path for discharging the charged capacitor C1, and FIG. 6 is a view illustrating a charging path for charging the capacitor C1 with the voltage of the second stack 12b.

In the deterioration detecting apparatus 23, the capacitor C1 is charged by each of the first and second stacks 12a and 12b. First, an example in which the capacitor C1 is charged with the voltage of the first stack 12a (hereinafter, also referred to as the "first stack voltage") will be described. As shown in FIG. 4, the first switch S1 and the second switch S2 are turned on, and the other switches S3 to S6 are turned off.

As a result, the positive electrode side of the first stack 12a is connected to the negative electrode side of the first stack 12a through the first resistor R1, the first switch S1, the fifth resistor R5, the capacitor C1, the second switch S2, and the second resistor R2. In other words, a first path P1 is formed so as to connect the first stack 12a and the capacitor C1, whereby the capacitor C1 is charged with the first stack voltage.

After the first path P1 is formed, if a predetermined time elapses, the voltage of the capacitor C1 is discharged. Specifically, as shown in FIG. 5, the first switch S1 and the second switch S2 are turned off while the fifth switch S5 and the sixth switch S6 are turned on.

As a result, in the voltage detection circuit unit 24, a second path P2 is formed as a discharging path. Since the other end of the fifth switch S5 is connected to the A/D converter 25, if the second path P2 is formed, the voltage of the capacitor C1 (that is, the first stack voltage) is input to the A/D converter 25. Also, if an analog value is input at the moment when the fifth and sixth switches S5 and S6 are turned on, the A/D converter 25 converts the analog value into a digital value, and outputsthe digital value to the control unit 26. As a result, the first stack voltage is detected.

Now, an example in which the capacitor C1 is charged with the voltage of the second stack 12b (hereinafter, also referred to as the "second stack voltage") will be described. As shown in FIG. 6, the third switch S3 and the fourth switch S4 are turned on, and the other switches S1, S2, S5, and S6 are turned off, As a result, the positive electrode side of the second stack 12b is connected to the negative electrode side of the second stack 12b through the third resistor R3, the third switch S3, the fifth resistor R5, the capacitor C1, the fourth switch S4, and the fourth resistor R4. In other words, a third path P3 is formed so as to connect the second stack 12b and the capacitor C1, whereby the capacitor C1 is charged with the second stack voltage.

After the third path P3 is formed, if predetermined time elapses, the third and fourth switches S3 and S4 are turned off while the fifth and sixth switch S5 and S6 are turned on, whereby the voltage of the capacitor C1 is discharged (see FIG. 5).

In other words, the second path P2 is formed in the voltage detection circuit unit 24, whereby the voltage of the capacitor C1 (that is, the second stack voltage) is input to the A/D converter 25. Then, as described above, the A/D converter 25 coverts the analog value of the input voltage into a digital value, and outputs the digital value to the control unit 26. As a result, the second stack voltage is detected.

Since charging and discharging on the capacitor C1 are performed by switching, between each charging path and the discharging path as described above, it is possible to detect the first stack voltage and the second stack voltage.

Also, in the circuit of the voltage detection circuit unit 24, as shown in FIG. 3, the insulating resistor Rp and the insulating resistor Rn are provided on the positive electrode side and negative electrode side of the assembled battery 10 described above, respectively. Also, each of the insulating resistors Rp and Rn represents the combined resistor of a mounted resistor and a resistor virtually representing insulation from the vehicle body GND. However, here, each insulating resistor may be any one of a mounted resistor and a virtual resistor.

The resistance value of each of the insulating resistors Rp and Rn is set to a sufficiently large value, for example, several MΩ such that the corresponding insulating resistor rarely conducts electricity when it is normal. However, when the insulating resistor Rp or Rn is abnormal due to a deterioration, for example, the resistance value thereof decreases, whereby the assembled battery 10 is short-circuited with the vehicle body GND or the like, or becomes a state close to a short-circuited state.

Figure 7:
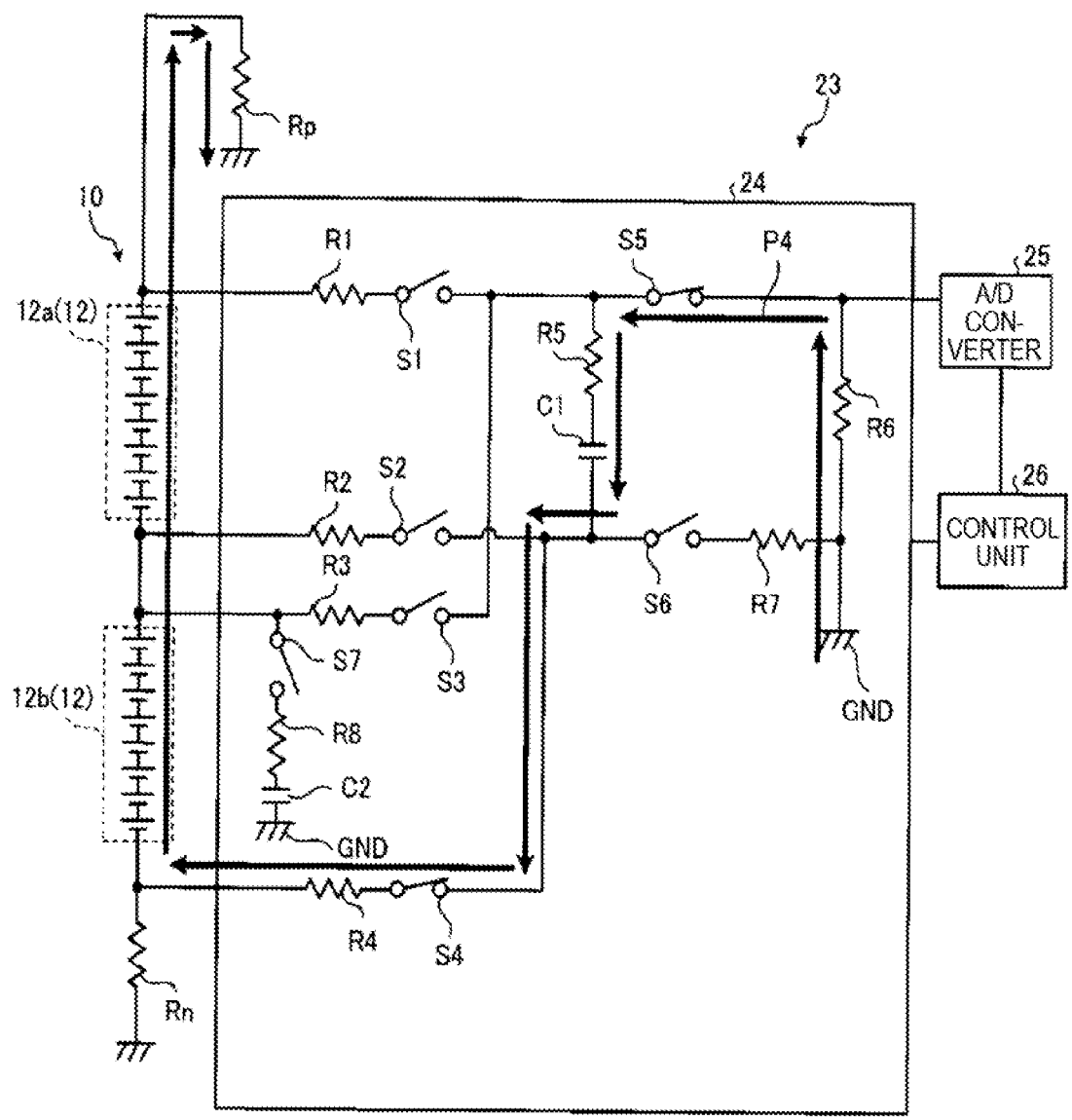
FIG. 7 is a view illustrating a charging path in a case of detecting a deterioration in an insulation resistor of the positive electrode side of an assembled battery.
Figure 8:
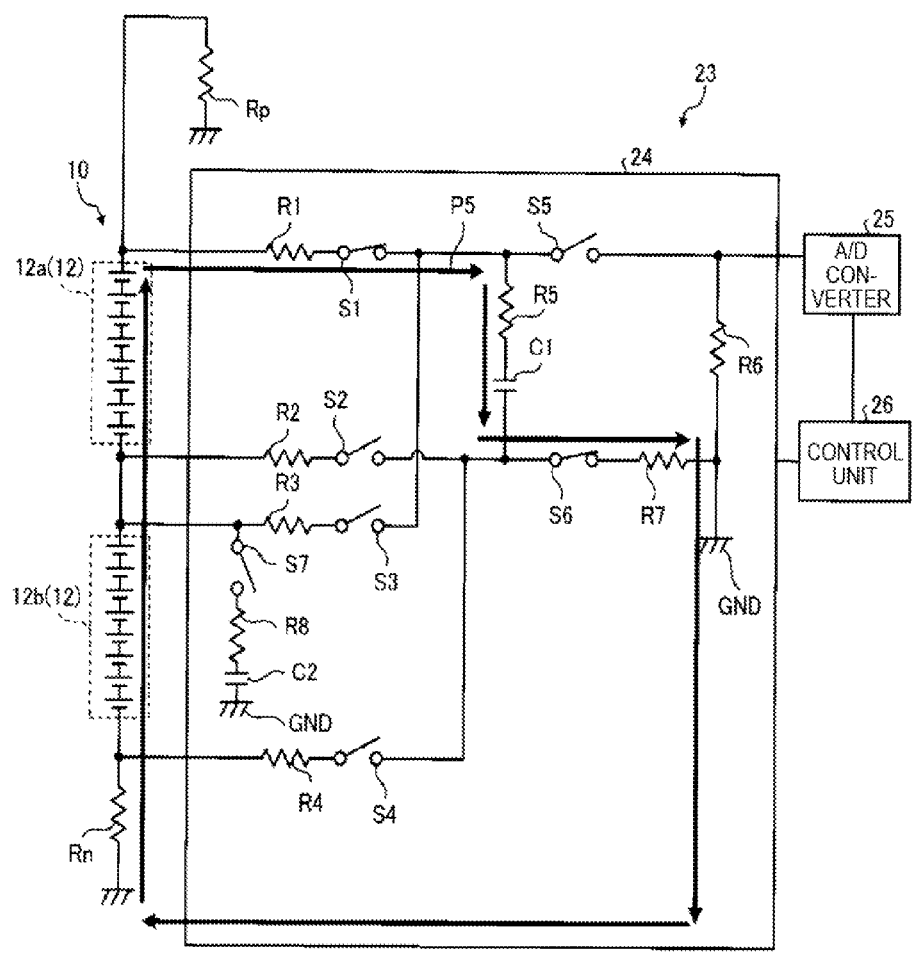
FIG. 8 is a view illustrating a charging path in a case of detecting a deterioration in an insulation resistor of the negative electrode side of the assembled battery.

Now, charging and discharging on the capacitor C1 which are performed in order to detect a deterioration in the insulating resistor Rp or Rn of the assembled battery 10 will be described with reference to FIGS. 7 and 8. FIG. 7 is a view illustrating a charging path in a case of detecting a deterioration in the insulating resistor Rp of the positive electrode side of the assembled battery 10. Also, FIG. 8 is a view illustrating a charging path in a case of detecting a deterioration in the insulating resistor Rn of the negative electrode side of the assembled battery 10.

First, in the case of detecting a deterioration in the insulating resistor Rp of the positive electrode side, as shown in FIG. 7, the fourth switch S4 and the fifth switch S5 are turned on, and the other switches S1 to S3 and S6 are turned off. As a result, the positive electrode side of the first stack 12a is connected to the negative electrode side of the first stack 12a through the insulating resistor Rp, the sixth resistor R6, the fifth switch S5, the fifth resistor R5, the capacitor C1 the fourth switch S4, the fourth resistor R4, and the second stack 12b.

In other words, a fourth path P4 is formed so as to connect the first and second stacks 12a and 12b and the capacitor C1 through the insulating resistor Rp of the positive electrode side. At this time, if the resistance value of the insulating resistor Rp is normal, the fourth path P4 rarely conducts electricity; whereas if the insulating resistor Rp has deteriorated, resulting in a decrease in the resistance value, the fourth path P4 conducts electricity.

After the fourth path P4 is formed, if a predetermined time elapses, the fourth switch S4 is turned off while the sixth switch S6 is turned on, whereby the voltage of the capacitor C1 is discharged (see FIG. 5). The voltage of the capacitor C1 detected at that time is referred to as the "voltage VRp", and on the basis of the voltage VRp, a deterioration in the insulating resistor Rp is detected. This will be described below.

In the case of detecting a deterioration in the insulating resistor Rn of the negative electrode side, as shown in FIG. 8, the first switch S1 and the sixth switch S6 are turned on, and the other switches S2 to S5 are turned off. As a result, the positive electrode side of the first stack 12a is connected to the negative electrode side of the first stack 12a through the first resistor R1, the first switch S1, the fifth resistor R5, the capacitor C1, the sixth switch S6, the seventh resistor R7, the insulating resistor Rn, and the second stack 12b.

In other words, a fifth path P5 is formed so as to connect the first and second stacks 12a and 12b and the capacitor C1 through the insulating resistor Rn of the negative electrode side. At this time, if the resistance value of the insulating resistor Rn is normal, the fifth path P5 rarely conducts electricity: whereas if the insulating resistor Rn has deteriorated, resulting in a decrease in the resistance value, the fifth path P5 conducts electricity.

After the fifth path P5 is formed, if a predetermined time elapses, as shown in FIG. 5, the voltage of the capacitor C1 is discharged. The voltage of the capacitor C1 detected at that time is referred to as the "voltage VRn", and on the basis of the voltage VRn, a deterioration in the insulating resistor Rn is detected. This will be described below.

Also, in a process of detecting a deterioration in the insulating resistor Rp or Rn, charging is performed for a predetermined time shorter than a time required to perform full charging, and the charged voltage is used as the voltage VRp or VRn to detect a deterioration in the insulating resistor Rp or Rn.

By the way, as described above, detection on a deterioration in the insulating resistor Rp or Rn is performed on the basis of the voltage VRp or VRn of the charged capacitor C1. Specifically, since the voltage with which the capacitor C1 is charged increases if a deterioration occurs in the insulating resistor Rp or Rn, in a case where the voltage of the charged capacitor C1 increases to a threshold value Va or greater, it is possible to detect a deterioration in the insulating resistor Rp or Rn.

However, for example, in a case where a deterioration occurs in elements, such as a capacitor C1 and the first to seventh resistors R1 to R7, positioned on a charging path, it may be impossible to accurately detect a deterioration in the insulating resistor Rp or Rn.

In other words, for example, in a case where the electrostatic capacity decreases due to a deterioration in the capacitor C1, the voltage with which the capacitor C1 is charged increases. For this reason, even though a deterioration has occurred in the capacitor C1, on the basis of an increase in the voltage of the capacitor, the deterioration in the capacitor may be erroneously detected as a deterioration in the insulating resistor Rp or Rn.

Meanwhile, for example, in a case where the electrostatic capacity increases due to a deterioration in the capacitor C1, the voltage with which the capacitor C1 is charged decreases. For this reason, even though a deterioration has occurred in the insulating resistor Rp or Rn, on the basis of a decrease in the voltage of the capacitor, it may be impossible to detect the deterioration in the insulating resistor Rp or Rn. Also, even in a case where a deterioration has occurred in elements other than the capacitor C1, such as the first to seventh resistors R1 to R7, having an influence on the time constant of the charging path, the deterioration may be erroneously detected, or may not be detected.

For this reason, the deterioration detecting apparatus 23 according to the first embodiment is configured so as to be able to detect a deterioration in elements positioned on a charging path for charging the capacitor C1. Hereinafter, the configuration of the deterioration detecting apparatus 23 will be described in more detail. Here, elements on a charging path mean electronic components, such as the capacitor C1 and the first to seventh resistors R1 to R7, having an influence on the time constant of the charging path.

As shown in FIG. 3, the voltage detection circuit unit 24 of the deterioration detecting apparatus 23 includes the deterioration detection switch S7, the deterioration detection resistor R8, and a capacitor C2. The deterioration detection switch S7 is provided between the vehicle body GND and the assembled battery 10 serving as an electric power source. Also, the vehicle body GND is an example of a ground point.

Specifically, the deterioration detection switch S7 is provided between the first and second stacks 12a and 12b adjacent to each other, more specifically, between the negative electrode side of the first stack 12a and the positive electrode side of the second stack 12b. Specifically, one end of the deterioration detection switch S7 is connected between the third resistor R3 and the connection point of the first and second stacks 12a and 12b.

Also, the position of the deterioration detection switch S7 described above is not limited to that example. For example, one end of the deterioration detection switch S7 may be connected between the second resistor R2 and the connection point of the first and second stacks 12a and 12b.

Further, for example, two deterioration detection switches S7 may be provided. In this case, one end of one of the deterioration detection switches S7 may be connected between the first stack 12a and the first resistor R1, and one end of the other may be connected between the second stack 12b and the fourth resistor R4. However, in the case of the configuration including one deterioration detection switch S7 as shown in FIG. 3, since it is possible to reduce the number of components as compared to the configuration including two deterioration detection switches S7, it is advantageous in terms of cost.

The deterioration detection resistor R8 and the capacitor C2 are connected in series between the other end of the deterioration detection switch S7 and the vehicle body GND. It is preferable that the resistance value of the deterioration detection resistor R8 should be set to a relatively small value, for example, the same resistance value as that in a case where electricity leaks due to a deterioration in the insulating resistor Rp or Rn. Also, the capacitor C2 is a capacitor for insulation to prevent current from continuously flowing in a case where the deterioration detection switch S7 is fixed in the ON state.

As shown in FIG. 2, the control unit 28 of the deterioration detecting apparatus 23 is a micro computer including a CPU, a RAM, a ROM, and so on, and controls the whole of the deterioration detecting apparatus 23 including the voltage detection circuit unit 24, the A/D converter 25, and so on. Specifically, the control unit 26 includes a charging-path forming unit 26a, a discharging-path forming unit 26b, a voltage detecting unit 26c, a charged-state monitoring unit 26d, and a deterioration detecting unit 26e.

The charging-path forming unit 26a controls the first to sixth switches S1 to S6, thereby forming any one of the first path P1 and the third to fifth paths P3 to P5, that is, a charging path (see FIG. 4 and FIGS. 6 to 8).

Also, a switching pattern of the first to sixth switches S1 to S6 and the deterioration detection switch S7 is stored in advance in a storage unit such as a RAM or a ROM. Then, the charging-path forming unit 26a or the discharging-path forming unit 26b reads the switching pattern from the storage unit at an appropriate timing, and forms a charging path or a discharging path.

The charging-path forming unit 26a also controls the first to sixth switches S1 to S6 and the deterioration detection switch S7 such that any one of the first and second stack 12a and 12b serving as an electric power source, the capacitor C1, and the vehicle body GND are connected, whereby a charging path for charging the capacitor C1 (hereinafter, also referred to as a "forced charging path") is formed.

Specifically, the charging-path forming unit 26a controls the deterioration detection switch S7 and so on, thereby forcibly forming, for example, the same charging path as that in a case where electricity leaks due to a deterioration in the insulating resistor Rp of the positive electrode side or the insulating resistor Rn of the negative electrode side.

Figure 9:
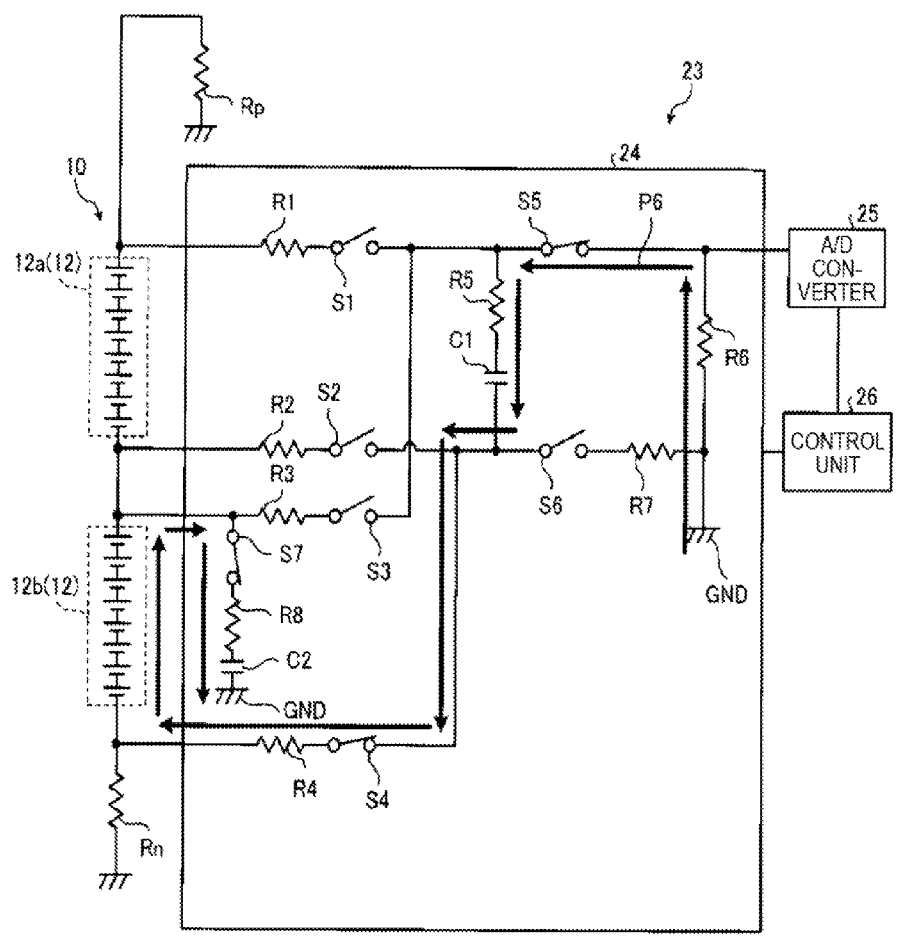
FIG. 9 is a view illustrating a forced charging path identical to that in a case where a leakage of electricity has occurred due to a deterioration in the insulation resistor of the positive electrode side.
Figure 10:
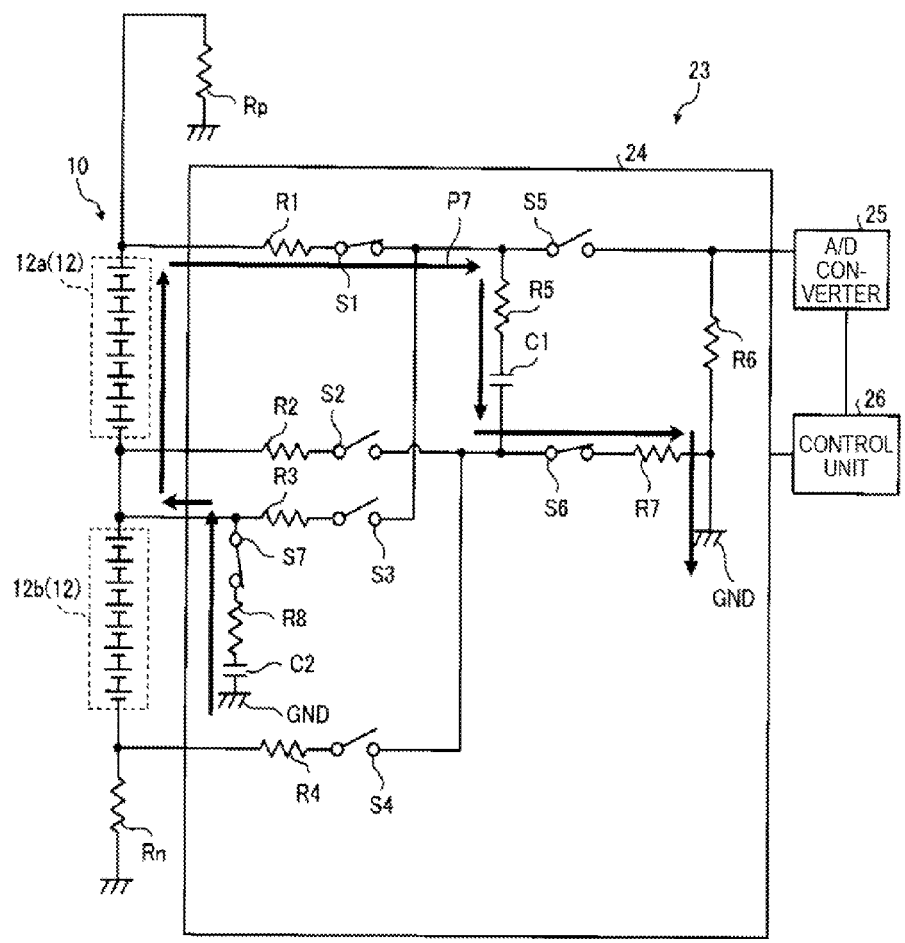
FIG. 10 is a view illustrating a forced charging path identical to that in a case where a leakage of electricity has occurred due to a deterioration in the insulation resistor of the negative electrode side.

FIG. 9 is a view illustrating a forced charging path identical to that in a case where electricity leaks due to a deterioration in the insulating resistor Rp of the positive electrode side, and FIG. 10 is a view illustrating a forced charging path identical to that in a case where electricity leaks due to a deterioration in the insulating resistor Rn of the negative electrode side.

As shown in FIG. 9, the charging-path forming unit 26a turns on the fourth switch S4, the fifth switch S5, and the deterioration detection switch S7, and turns off the other switches S1 to S3 and S6. As a result, the positive electrode side of the second stack 12b is connected to the negative electrode side of the second stack 12b through the deterioration detection switch S7, the deterioration detection resistor R8, the capacitor C2, the sixth resistor R6, the fifth switch S5, the fifth resistor R5, the capacitor C1, the fourth switch S4, and the fourth resistor R4. In other words, a sixth path P6 (a forced charging path) is formed so as to connect the second stack 12b and the capacitor C1 through the deterioration detection switch S7.

Also, as shown in FIG. 10, the charging-path forming unit 26a turns on the first switch S1, the sixth switch S6, and the deterioration detection switch S7, and turns off the other switches S2 to S5. As a result, the positive electrode side of the first stack 12a is connected to the negative electrode side of the first stack 12a through the first resistor R1, the first switch S1, the fifth resistor R5, the capacitor C1, the sixth switch S6, the seventh resistor R7, the capacitor C2, the deterioration detection resistor R8, and the deterioration detection switch S7. In other words, a seventh path P7 (a forced charging path) is formed so as to connect the first stack 12a and the capacitor C1 through the deterioration detection switch S7.

The sixth path P6 and the seventh path P7 described above are examples of a charging path. Also, the first path P1 and the third to fifth paths P3 to P5 described as charging paths are, also formed by the charging-path forming unit 26a.

After the sixth path P6 is formed, if a predetermined time elapses, the discharging-path forming unit 26b turns off the deterioration detection switch S7 and the fourth switch S4 while turning on the sixth switch S6, whereby the voltage of the capacitor C1 is discharged (see FIG. 5).

Meanwhile, after the seventh path P7 is formed, if a predetermined time elapses, the discharging-path forming unit 26b turns off the deterioration detection switch S7 and the first switch S1 while turning on the fifth switch S5, whereby the voltage of the capacitor C1 is discharged (see FIG. 5). Also, even after any one of the first path P1 and the third to fifth paths P3 to P5 is formed, the discharging-path forming unit 26b forms the discharging path.

If the discharging path is formed by the discharging-path forming unit 26b, the voltage detecting unit 26c detects the voltage of the charged capacitor C1 through the A/D converter 25. Hereinafter, the voltage of the capacitor C1 charged by the sixth path P6 will also be referred to as the "voltage VRpa", and the voltage of the capacitor C1 charged by the seventh path P7 will also be referred to as the "voltage VRna". Also, the voltage detecting unit 26c detects the first and second stack voltages, the voltages VRp and VRn, and the voltages VRpa and VRna.

Further, the voltage detecting unit 26c outputs a signal representing the voltage of the capacitor C1 detected, to the charged-state monitoring unit 26d and the deterioration detecting unit 26e.

In a case where the capacitor C1 is charged by the first path P1 or the third path P3 (see FIGS. 4 and 6) and then the first or second stack voltage is detected, the charged-state monitoring unit 26d monitors the charged state of the first or second stack 12a or 12b on the basis of the detected first or second stack voltage. Then, the charged-state monitoring unit 26d outputs information representing the result of monitoring on the charged state of the assembled battery 10 including the first and second stacks 12a and 12b, to the vehicle control device 30 (see FIG. 1). According to the result of monitoring on the charged state of the assembled battery 10, the vehicle control device 30 performs vehicle control as described above.

In a case where the capacitor C1 is charged by the fourth path P4 or the fifth path P5 (see FIGS. 7 and 8) and then the voltage VRp or VRn of the capacitor C1 is detected, on the basis of the detected voltage, the deterioration detecting unit 26e detects a deterioration in the insulating resistor Rp or Rn.

Specifically, in a case where there is no deterioration in the insulating resistor Rp or the insulating resistor Rn and thus there is no decrease in the resistance value thereof, the capacitor C1 is rarely charged, or is charged with a low voltage. Therefore, the deterioration detecting unit 26e compares the voltage VRp or the voltage VRn with a relatively small threshold value Va set in advance.

In a case where the voltage VRp of the capacitor C1 is equal to or greater than the threshold value Va, the deterioration detecting unit 26e detects a deterioration in the insulating resistor Rp, in other words, it determines that an abnormality has occurred in the insulating resistor Rp. Meanwhile, in a case where the voltage VRp is less than the threshold value Va, the deterioration detecting unit determines that there is no deterioration in the insulating resistor Rp, in other words, that the insulating resistor Rp is normal.

Similarly, in a case where the voltage VRn is equal to or greater than the threshold value Va, the deterioration detecting unit 26e detects a deterioration in the insulating resistor Rn; whereas in a case where the voltage VRn is less than the threshold value Va, the deterioration detecting unit determines that there is no deterioration in the insulating resistor Rn. In the above description, the voltages VRn and VRp are compared with the common threshold value Va. However, the present invention is not limited thereto. Different threshold values may be set and used.

Meanwhile, in a case where the capacitor C1 is charged by the sixth path P6 or the seventh path P7 (see FIGS. 9 and 10) and the voltage VRpa or VPna of the capacitor C1 is detected, on the basis of the detected voltage, the deterioration detecting unit 26e detects a deterioration in elements such as the capacitor C1 positioned on the charging path.

Specifically, the deterioration detecting unit 26e determines whether the voltage VRpa or VPna of the capacitor C1 charged by the sixth path P6 or the seventh path P7 is within a range Wa determined in advance. For example, the range Wa is set to a voltage range including a normal voltage which is calculated on the basis of the electrostatic capacity of the capacitor C1, the resistance values of the first to seventh resistors R1 to R7, and the resistance value of the deterioration detection resistor R8 in a normal state where there is no deterioration, and is stored in the storage unit, in advance.

Therefore, in a case where the voltage VRpa of the capacitor C1 charged by the sixth path P6 is within the predetermined range Wa, the deterioration detecting unit 26e can determine that there is no deterioration in the elements such as the capacitor C1 positioned on the charging path (here, the sixth path P6). Meanwhile, in a case where the voltage VRpa of the capacitor C1 is out of the predetermined range Wa, the deterioration detecting unit 26e can detect a deterioration in the elements positioned on the charging path (the sixth path P6).

Similarly, in a case where the voltage VRna of the capacitor C1 charged by the seventh path P7 is within the predetermined range Wa, the deterioration detecting unit 26e can determine that there is no deterioration in the elements such as the capacitor C1 positioned on the charging path (here, the seventh path P7). Meanwhile, in a case where the voltage VRna of the capacitor C1 is out of the predetermined range Wa, the deterioration detecting unit 26e can detect a deterioration in the elements positioned on the charging path (the seventh path P7). In the above description, the voltages VRna and VRpa are compared with the common predetermined range Wa. However, the present invention is not limited thereto. Different ranges may be set in advance and be used.

Further, the deterioration detecting unit 26e outputs information representing the deterioration states of the insulating resistor Rp and Rn and the elements positioned on the charging path, to the vehicle control device 30 and the like. Then, the vehicle control device 30 performs vehicle control according to the deterioration states, an operation of issuing a notification to a user, and so on.

<3. Specific Operations of Charged-State Monitoring Process and Deterioration Detecting Process>

Figure 11:
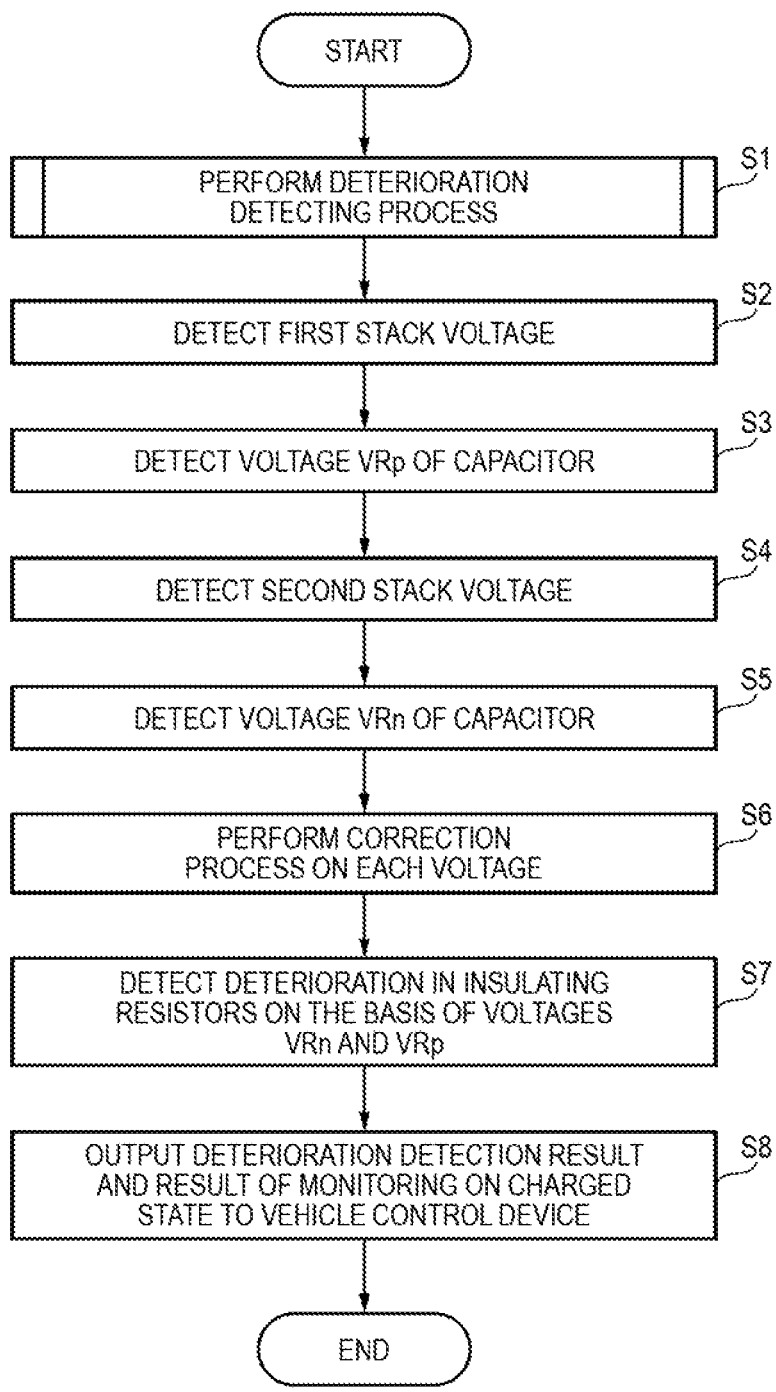
FIG. 11 is a flow chart illustrating a part of the process procedure of processes which are performed in a battery monitoring system.

Now, specific operations of a charged-state monitoring process and a deterioration detecting process which are performed in the battery monitoring system 20 configured as described above will be described with reference to FIG. 11. FIG. 11 is a flow chart illustrating a portion of the process procedure of processes which are performed by the battery monitoring system 20. Also, the various processes shown in FIG. 11 are performed on the basis of control of the deterioration detecting apparatus 23 of the control unit 26.

Figure 12:
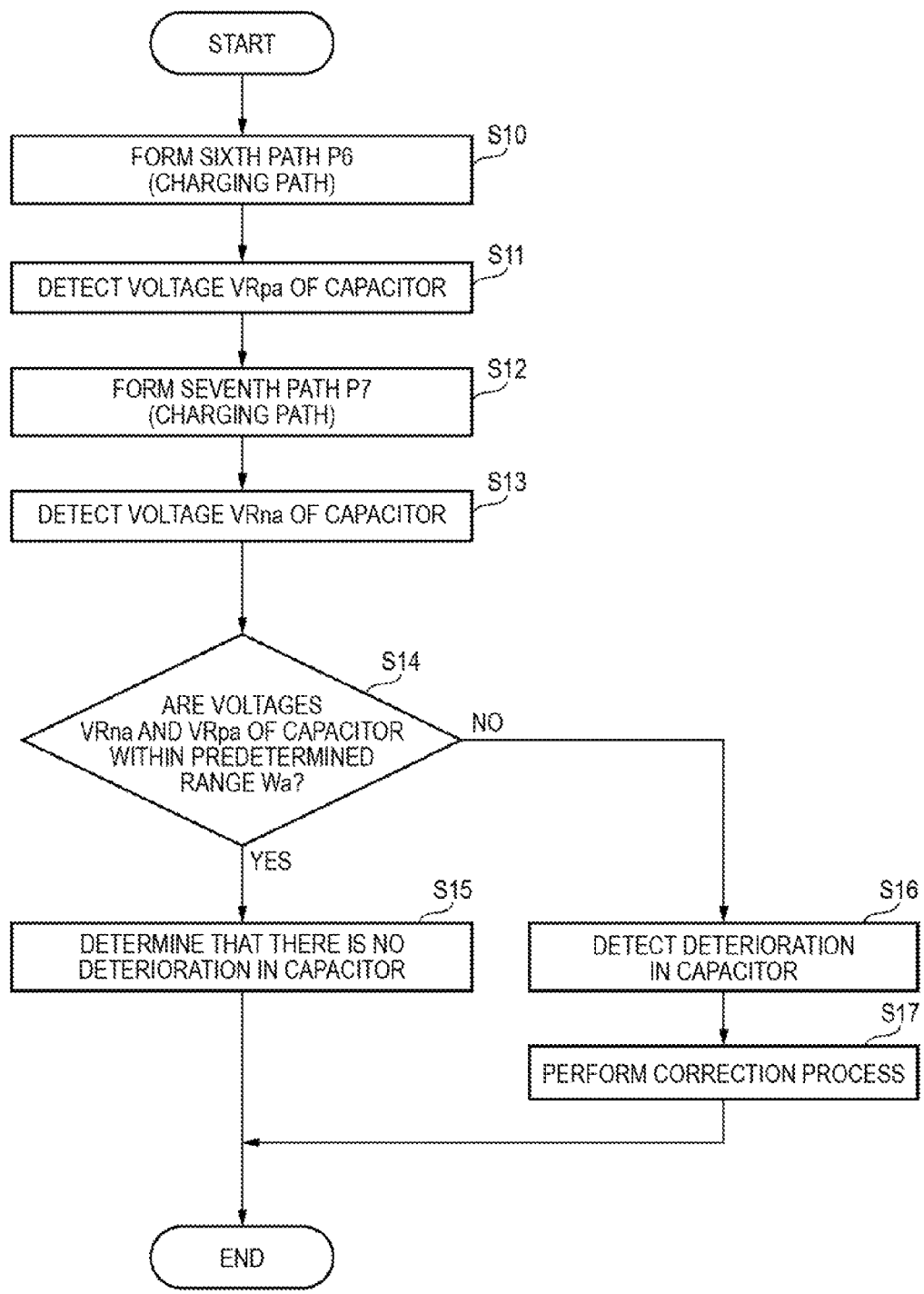
FIG. 12 is a flow chart illustrating a deterioration detecting process.

As shown in FIG. 11 first, in STEP S1, a deterioration detecting process on elements such as the capacitor C1 positioned on charging paths is performed. FIG. 12 is a flow chart illustrating the deterioration detecting process. As shown in FIG. 12, in STEP S10, the charging-path forming unit 26a of the control unit 26 controls the deterioration detection switch S7 and the like, thereby forming the sixth path P6 (see FIG. 9). Subsequently, in STEP S11, the voltage detecting unit 26c detects the voltage VRpa of the capacitor C1 on the discharging path formed by the discharging-path forming unit 26b.

Subsequently, in STEP S12, the charging-path forming unit 26a controls the deterioration detection switch S7 and the like, thereby forming the seventh path P7 (see FIG. 10). Thereafter, in STEP S13, the voltage detecting unit 26c detects the voltage VRna of the capacitor C1 on the discharging path formed by the discharging-path forming unit 26b.

Subsequently, in STEP S14, the deterioration detecting unit 26e determines whether the voltages VRna and VRpa of the capacitor C1 detected in the STEPS S11 and S13 are within the predetermined range Wa. In a case where the voltages VRna and VRpa of the capacitor C1 are within the predetermined range Wa ("Yes" in STEP S14), in STEP S15, the deterioration detecting unit 26e determines that there is no deterioration in the elements such as the capacitor C1 positioned on the charging paths.

Meanwhile, in a case where any one of the voltages VRna and VRpa of the capacitor C1 is out of the predetermined range Wa ("No" in STEP S14), in STEP S16, the deterioration detecting unit 26e detects a deterioration in the elements such as the, capacitor C1 positioned on the charging paths.

Subsequently, in STEP S17, the deterioration detecting unit 26e performs a correction process according to the deterioration states of the elements positioned on the charging paths. Specifically, for example, in a case where the capacitor C1 has deteriorated, resulting in a decreased in the electrostatic capacity thereof, since the voltage of the charged capacitor C1 increases, the deterioration detecting unit performs a correction process to compensate for the increase in the voltage.

In other words, in the correction process, according to the increase in the voltage, the deterioration detecting unit calculates a correction coefficient to be used to correct the voltage or the like of the capacitor C1 to be detected in the subsequent process, or corrects the threshold value Va of the deterioration detecting unit 26e. Also, as the voltage correction coefficient, a multiplication coefficient or an addition coefficient can be used. However, the voltage correction coefficient is not limited thereto.

Meanwhile, in a case of determining in STEP S15 that there is no deterioration in the elements positioned on the charging paths, correction on the threshold value Va is not performed, or the voltage correction coefficient is set such that a correction amount becomes zero (for example, in a case where the voltage correction coefficient is a multiplication coefficient, it is set to 1; whereas in a case where the voltage correction coefficient is an addition coefficient, it is set to 0). In the following description, as the correction process, each voltage is corrected on the basis of the correction coefficient.

In this way, for example, the threshold value Vs or the like can be corrected to an accurate value on the basis of the deterioration states, whereby it is possible to accurately monitor the charged state of the assembled battery 10. However, the method of correction is not limited to the above described method. Alternatively, the deterioration detecting unit may be configured so as not to perform the correction process.

Also, in the above description, the sixth path P6 and the seventh path P7 are sequentially formed as charging paths. However, the present invention is not limited thereto. The seventh path P7 and the sixth path P6 may be sequentially formed. Also, in the above description, the voltages VRna and VRpa are detected, and then are compared with the predetermined range Wa. However, the present invention is not limited thereto. For example, whenever the voltage VRpa or the voltage VRna is detected, the detected voltage may be compared with the predetermined range Wa. Alternatively, the deterioration detecting unit may be configured so as to add the voltage VRpa and the voltage VRna and compare the sum with another predetermined range, thereby detecting a deterioration in the elements positioned on the charging paths.

Subsequently, as shown in FIG. 11, the control unit 26 detects the first stack voltage of the first stack 12a in STEP 82, and then detects the voltage VRp of the capacitor C1 in STEP S3. Subsequently, the control unit 26 detects the second stack voltage of the second stack 12b in STEP S4, and then detects the voltage VRn of the capacitor C1 in STEP S5.

Subsequently, in STEP S6, the control unit 26 corrects the first and second stack voltages and the voltages VRn and VRp of the capacitor C1 with the correction coefficient calculated in STEP S17. Therefore, for example, the stack voltages and the like can be corrected to accurate values on the basis of the deterioration states, whereby it is possible to more accurately monitor the charged state of the assembled battery 10.

Subsequently, in STEP S7, on the basis of the voltages VRn and VRp of the capacitor C1, the deterioration detecting unit 26e of the control unit 26 detects a deterioration in the insulating resistors Rp and Rn. In STEP S7, since the voltages VRn and VRp of the capacitor C1 have been corrected according to the deterioration state of the capacitor C1, it is possible to accurately detect a deterioration in the insulating resistor Rp or Rn.

Subsequently, in STEP S8, the control unit 26 outputs information representing the deterioration states of the insulating resistors Rp and Rn and the elements positioned on the charging paths, and information representing the first and second stack voltages, as the deterioration detection result and the result of monitoring on the charged state of the assembled battery 10, to the vehicle control device 30, respectively.

As described above, the deterioration detecting apparatus 23 according to the first embodiment includes the capacitor C1, the deterioration detection switch S7, the charging-path forming unit 26a, the voltage detecting unit 26c, and the deterioration detecting unit 26e. The capacitor C1 is connected to the electric power sources through the first switch S1 to the sixth switch S6 (connection switches). The deterioration detection switch S7 is provided between the electric power sources and the vehicle body GND (a ground point). The changing-path forming unit 26a controls the first switch S1 to the sixth switch S6, and the deterioration detecting unit 26e, such that an electric power source, the capacitor C1, and the vehicle body GND are connected, whereby a charging path (the sixth path P6 or the seventh path P7) for charging the capacitor C1 is formed. The voltage detecting unit 26c detects the voltage VRpa or VRna of the capacitor C1 charged through the charging path. On the basis of the voltages VRna or VRpa of the capacitor C1, the deterioration detecting unit 26e detects a deterioration in the elements such as the capacitor C1 positioned on the charging path.

Therefore, with a simple configuration, it is possible to detect a deterioration in elements such as the capacitor C1 positioned on a charging path for charging the capacitor C1. Also, since the elements such as the capacitor C1 positioned on each charging path do not quickly deteriorate, the deterioration detecting process of STEP S1 of FIG. 11 may be performed at a frequency lower than the frequency of the voltage detecting process of STEPS S2 to S. For example, whenever the voltage detecting process of STEPS S2 to S5 is performed a plurality of times, once, the deterioration detecting process of STEP S1 may be performed and the correction coefficient may be updated with a new value.

<4. Configuration of Deterioration Detecting Apparatus According to Second Embodiment>

(Second Embodiment)

Now, a changing/discharging system 1 including a deterioration detecting apparatus 23 according to a second embodiment will be described. Hereinafter, components identical to those of the first embodiment are denoted by the same reference symbols, and will not be described.

In the second embodiment, in a case where the capacitor C1 is charged through a charging path for detecting a deterioration in the insulating resistor Rp or Rn, on the basis of the voltages VRn or VRp of the charged capacitor and the voltage of the capacitor C1 during discharging, a deterioration in the insulating resistor Rp or Rn is detected.

Specifically, the voltage VRn or VRp of the charged capacitor C1 increases or decreases not only according to the deterioration state of the insulating resistor Rp or Rn but also according to the deterioration states of the elements such as the capacitor C1. For this reason, for example, in a case where there is an increase in the voltage VRn or VRp of the capacitor C1, it is difficult to determine whether the increase in the voltage was attributable to a deterioration in the elements such as the capacitor C1, or to a deterioration in the insulating resistor Rp or Rn, and thus it is difficult to accurately detect a deterioration in the insulating resistor Rp or Rn.

For this reason, in the second embodiment, the deterioration detecting apparatus 23 is configured so as to be able to accurately detect a deterioration in the insulating resistor Rp or Rn while considering the deterioration states of the elements such as the capacitor C1.

Figure 13:
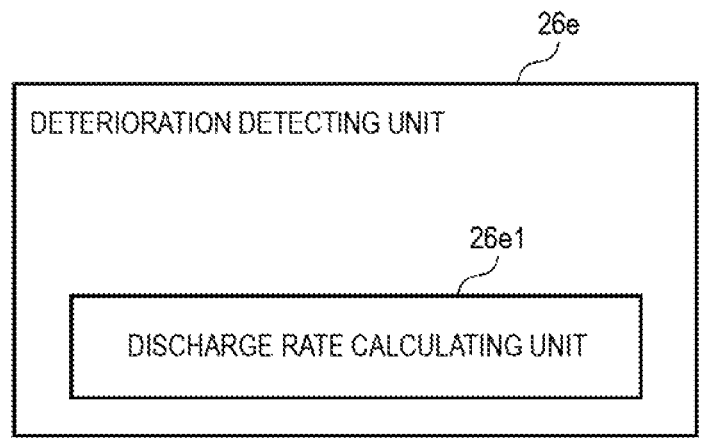
FIG. 13 is a view illustrating an example of the configuration of a deterioration detecting unit of a deterioration detecting apparatus according to a second embodiment.

FIG. 13 is a block diagram illustrating an example of the configuration of the deterioration detecting unit 26e of the deterioration detecting apparatus 23. As shown in FIG. 13, the deterioration detecting unit 26e includes a discharge rate calculating unit 26e1 for calculating the discharge rate D of the capacitor C1.

Figure 14:
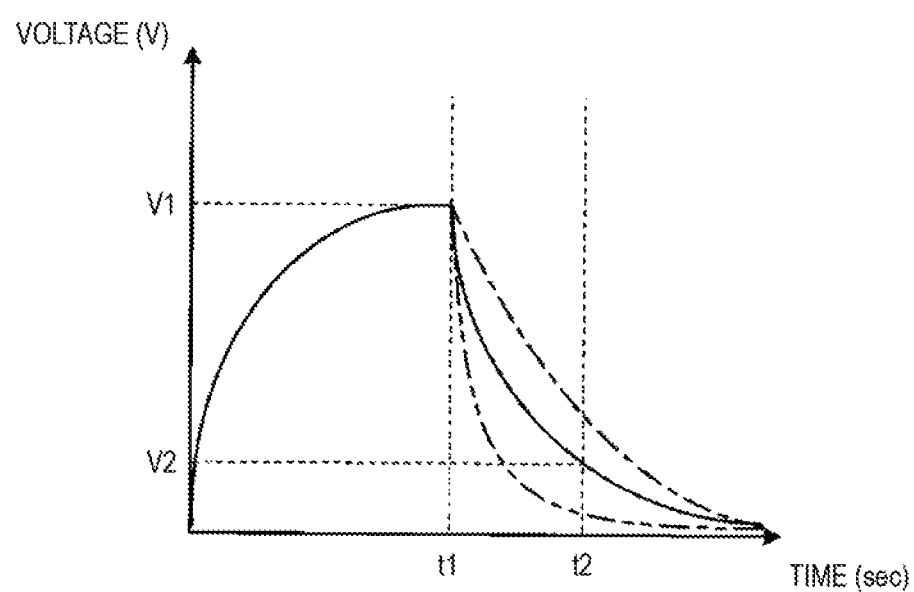
FIG. 14 is a graph illustrating variation of the voltage of a capacitor.

FIG. 14 is a graph illustrating variation of the voltage of the capacitor C1. In an example shown in FIG. 14, a time when charging of the capacitor C1 through the first path P1 or the third path P3 finishes and discharging starts is a "time t1", and a time after a predetermined time from the time t1 is a "time t2", and discharging is performed for the predetermined time. Also, the predetermined time from the time t1 to the time t2 can be set to an arbitrary value. For example, it is preferable that the predetermined time should be set so as to be shorter than a time from when discharging of the capacitor C1 starts to when discharging is completed. Also, the time t1 is not limited to the time when discharging starts, and may be a time after a small amount of time from the time when discharging starts.

As shown in FIG. 14, the discharge rate D is calculated on the basis of the voltage V1 of the capacitor C1 at the time when charging finishes (that is, at the time t1), and the voltage V2 of the capacitor C1 at the time after the predetermined time from when discharging of the charged capacitor C1 starts (that is, at the time t2). Also, the voltage V1 of the capacitor C1 at the time t1 corresponds to the first stack voltage or the second stack voltage described above, and will also be hereinafter referred to as the voltage V1 for the purpose of easy understanding. Note that the "corresponds to" does not always indicate a value of the voltage V1 of the capacitor C1 at the time t1 is the same as a value of the first stack voltage or a value of the second stack voltage.

Specifically, as shown by the following Expression (1), the voltage V2 after the predetermined time from when discharging starts is subtracted from the voltage V1 of the capacitor C1 at the time when charging finishes, and the value obtained by the subtraction is divided by the voltage V1, whereby the discharge rate D is obtained. In other words, the discharge rate D is a value representing the discharge ratio of the capacitor C1, in other words, the voltage decrease ratio of the capacitor C1 during discharging.

$$[\text{Discharge Rate } D] = (V1 - V2)/V1 \quad \text{Expression (1)}$$

Now, the relation between a deterioration in the elements such as the capacitor C1 and the discharge rate D will be described. For example, in a case where the electrostatic capacity of the capacitor C1 is lower than a normal electrostatic capacity, since the time constant of the discharging path decreases, discharging is rapidly performed, in other words, the discharge rate D increases as compared to a normal discharge rate. Also, in FIG. 14, variation of the voltage when the electrostatic capacity of the capacitor C1 is normal is, shown by a solid line, and variation of the voltage when the electrostatic capacity has decreased due to a deterioration in the capacitor C1 is shown by an alternate long and two short dashes line.

Meanwhile, for example, in a case where the capacitor C1 has deteriorated, whereby the electrostatic capacity has become higher than the normal electrostatic capacity, since the time constant of the, discharging path increases, as shown by an alternate long and short dash line, discharging is slowly performed, in other words, the discharge rate D becomes smaller than the normal discharge rate.

Further, the discharge rate D is not influenced by the value of the voltage V1 of the capacitor C1. In other words, the discharge rate D is substantially constant even if the voltage V1 changes, but increases or decreases according to variation of the time constant. Therefore, although the voltage V1 varies according to the charged state of the battery stack 12, even though the voltage V1 changes, if the discharge rate D is calculated, it is possible to accurately determine whether the time constant of the discharging path has changed, that is, whether the capacitor C1 or the like has deteriorated.

As described above, in the second embodiment, in view of the relation between a deterioration in the capacitor C1 or the like and the discharge rate D, a deterioration in the capacitor C1 is detected and a deterioration in the insulating resistor Rp or Rn is accurately detected. Also, a deterioration in elements other than the capacitor C1, such as the fifth to seventh resistors R5 to R7, having an influence on the time constant of the discharging path has also a relation with the discharge rate D as described above.

<5. Specific Operations of Charged-State Monitoring Process and Deterioration Detecting Process According to Second Embodiment>

Figure 15:
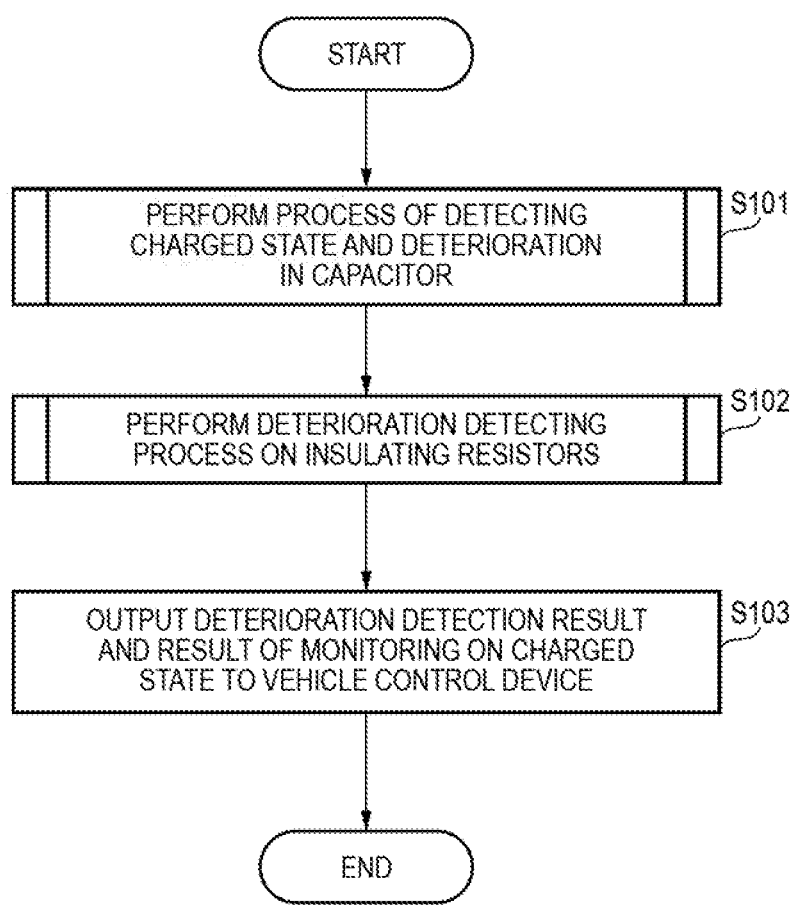
FIG. 15 is a flow chart illustrating a part of the process procedure of processes which are performed in a battery monitoring system according to the second embodiment.

Now, specific operations of a charged-state monitoring process and a deterioration detecting process on the capacitor C1 and the insulating resistors Rp and Rn which are performed in the battery monitoring system 20 according to the second embodiment will be described with reference to FIG. 15. FIG. 15 is a flow chart illustrating a part of the process procedure of processes which are performed by the battery monitoring system 20 according to the second embodiment.

Figure 16:
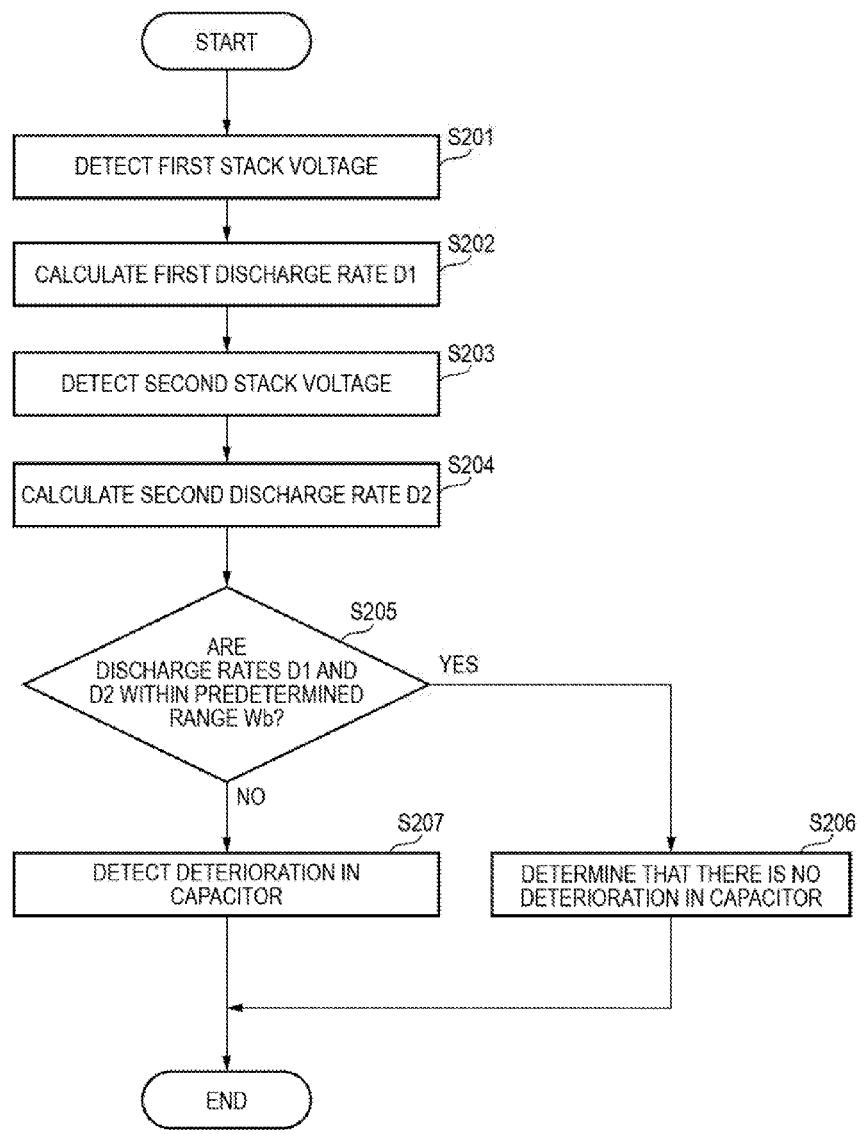
FIG. 16 is a flow chart illustrating the process procedure of a charged-state detecting process and a capacitor deterioration detecting process.

As shown in FIG. 15, first, in STEP S101, the control unit 26 performs a process of detecting the charged states of the first and second stacks 12a and 12b and a deterioration in the capacitor C1. FIG. 16 is a flow chart illustrating the process procedure of the charged-state monitoring process and the deterioration detecting process on the capacitor C1.

As shown in FIG. 16, the control unit 26 detects the first stack voltage of the first stack 12a in STEP S201, and then calculates a first discharge rate D1 in STEP S202. Specifically, the control unit 26 detects the voltage V1 of the charged capacitor C1 at the time t1, as the first stack voltage, and then detects the voltage V2 at the time t2 after the predetermined time when discharging is performed, and calculates the first discharge rate D1 on the basis of the detected voltages V1 and V2.

Subsequently, the control unit 26 detects the second stack voltage of the second stack 12b in STEP S203, and calculates a second discharge rate D2 in STEP S204. Calculation of the second discharge rate D2 is the same as the calculation of the first discharge rate D1. In other words, the control unit 26 detects the voltage V1 obtained by charging the capacitor C1, as the second stack voltage, and then detects the voltage V2 obtained by discharging the capacitor, and calculates the second discharge, rate D2 on the basis of the detected voltages V1 and V2.

Subsequently, in STEP S205, the deterioration detecting unit 26e of the control unit 26 determines whether the discharge rates D1 and D2 are within a range Wb determined in advance. For example, the predetermined range Wb is set to a range including a normal discharge rate which is calculated on the basis of the electrostatic capacity of the capacitor C1 the resistance values of the first to seventh resistors R1 to R7 in a normal state where there is no deterioration, and is stored in the storage unit, in advance.

In the process of STEP S205, the average value of the first and second discharge rates D1 and D2 can be used as the discharge rate D. However, the discharge rate D is not limited thereto. For example, the deterioration detecting unit 26e may compare each of the first discharge rate D1 and the second discharge rate D2 with the predetermined range Wb, or may compare any one of the first and second discharge rates D1 and D2 with the predetermined range Wb.

In a case where the discharge rates D1 and D2 are within the predetermined range Wb ("Yes" in STEP S205), in STEP S206, the deterioration detecting unit 26e determines that there is no deterioration in elements such as the capacitor C1 positioned on the discharging path. Here, the elements on the discharging path mean electronic components, such as the capacitor C1 and the fifth to seventh resistors R5 to R7, having an influence on the time constant of the discharging path.

Meanwhile, in a case where any one of the discharge rates D1 and D2 is out of the predetermined range Wb ("No" in STEP S205), in STEP S207, the deterioration detecting unit 26e detects a deterioration in the elements such as the capacitor C1 positioned on the discharging path.

Also, the process of calculating each discharge rate D and the deterioration detecting process on the capacitor C1 may be performed at a frequency lower than the frequency of the voltage detecting process of STEP S201 or S203. For example, whenever the voltage detecting process of STEP S201'or 5203 is performed a plurality of times, the deterioration detecting process of STEP S202 and STEPS S204 to S207 may be performed once.

Figure 17:
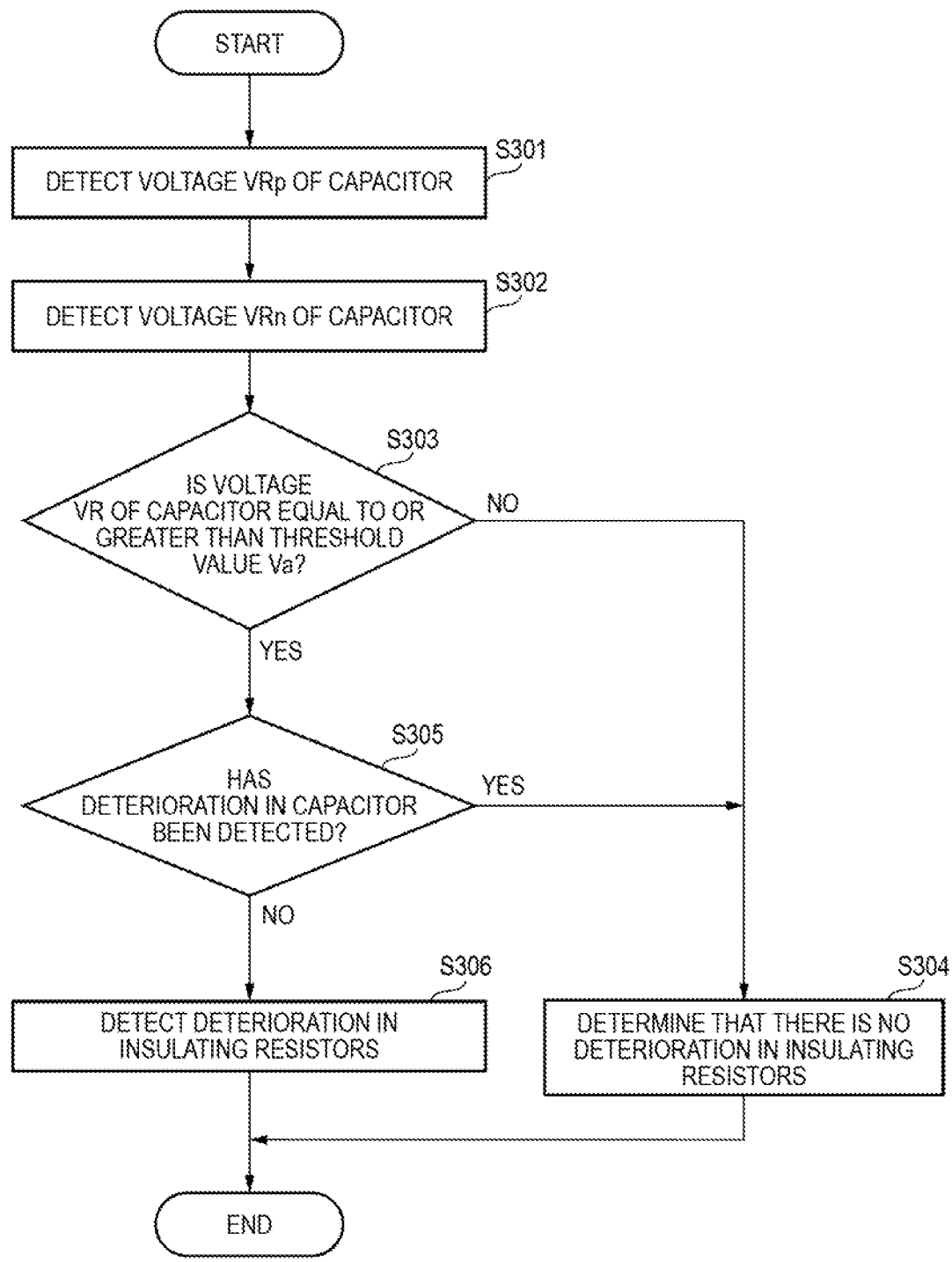
FIG. 17 is a flow chart illustrating the process procedure of an insulation resistor deterioration detecting process.

Subsequently, as shown in FIG. 15 in STEP S102, the control unit 26 performs a process of detecting a deterioration in the insulating resistor Rp or Rn, FIG. 17 is a flow chart illustrating the process procedure of the deterioration detecting process on the insulating resistors Rp and Rn.

The control unit 26 detects the voltage VRp of the capacitor C1 in STEP S301, and then detects the voltage VRn of the capacitor C1 in STEP S302. Hereinafter, for the purpose of easy understanding, a term "voltage VR" including the detected voltage VRp or voltage VRn, a voltage (VRn+VRn) obtained by adding the voltages VRn and VRp, or the like will be sometimes used. In other words, the voltage VR means the voltage of the capacitor C1 charged by a charging path (the fourth path P4 or the fifth path P5) for detecting a deterioration in the insulating resistor Rp or Rn.

In STEP S303, the deterioration detecting unit 26e of the control unit 26 determines whether the voltage VR of the capacitor C1 is equal to or greater than the threshold value Va. In a case where the voltage VR of the capacitor C1 is less than the threshold value Va ("No" in STEP S303), in STEP S304, the deterioration detecting unit 26e determines that there is no deterioration in the insulating resistors Rp or Rn.

Meanwhile, in a case where the voltage VR of the capacitor C1 is equal to or greater than the threshold value Va ("Yes" in STEP S303), in STEP S305, the deterioration detecting unit 26e determines whether a deterioration in the capacitor C1 has been detected.

In a case where a deterioration in the capacitor C1 has been detected ("Yes" in STEP S305), since it is possible to assume that the voltage VR has become equal to or greater than the threshold value Va due to the deterioration in the capacitor C1, the deterioration detecting unit 26e proceeds to STEP S304 in which it determines that a deterioration in the insulating resistor Rp or Rn has not been detected, that is, there is no deterioration in the insulating resistor Rp or Rn.

Therefore, the deterioration detecting unit 26e can prevent a state where the voltage VR has become equal to or greater than the threshold value Va due to a deterioration in the capacitor C1 from being erroneously determined as a state where there is a deterioration in the insulating resistor Rp or Rn, and thus can accurately detect a deterioration in the insulating resistor Rp or Rn.

Meanwhile, in a case where a deterioration in the capacitor C1 has not been detected ("No" in STEP S305), in STEP S306, the deterioration detecting unit 26e detects a deterioration in the insulating resistor Rp or Rn. In other words, since the discharge rate D is within the predetermined range Wb, and there is no deterioration in the elements such as the capacitor C1 positioned on the discharging path, it is possible to assume that the voltage VR of the capacitor C1 has become equal to or greater than the threshold value Va due to a deterioration in the insulating resistor Rp or Rn.

As described above, the deterioration detecting unit 26e can accurately detect a deterioration in the insulating resistor Rp or Rn by considering the deterioration states of the capacitor C1 and the like, specifically, by using the voltage (the discharge rate D) of the capacitor C1 during discharging.

Subsequently, as shown in FIG. 15, in STEP S103, the control unit 26 outputs information representing the deterioration states of the insulating resistors Rp and Rn and the elements positioned on the discharging path, and information representing the first and second stack voltages, as the deterioration detection result and the result of monitoring on the charged, state of the assembled battery 10, to the vehicle control device 30, respectively.

As described above, the deterioration detecting apparatus 23 according to the second embodiment includes the capacitor C1, the voltage detecting unit 26c, and the deterioration detecting unit 26e. The capacitor C1 is connected to an insulated electric power source, thereby being charged or discharged. The voltage detecting unit 26c detects the voltage of the capacitor C1. The deterioration detecting unit 26e detects a deterioration in the insulating resistor Rp or Rn on the basis of the voltage VR of the capacitor C1 charged through a charging path for detecting a deterioration in the insulating resistor Rp or Rn serving as an electric power source, and the voltage V2 of the capacitor C1 during discharging.

Therefore, it is possible to improve the accuracy of detection on a deterioration in the insulating resistor Rp or Rn serving as an electric power source. Also, in the second embodiment, it becomes possible to eliminate the deterioration detection switch S7 and the deterioration detection resistor RB. In this case, it is possible to reduce the number of components, and it is possible to reduce the size and cost of the deterioration detecting apparatus 23. Also, the other configuration and effects are the same as those of the first embodiment, and thus will not be described.

<6. Modification Of Second Embodiment>

Now, a modification of the second embodiment will be described. In this modification, in a case where a deterioration in the capacitor C1 is detected, according to the deterioration state, the voltage VR of the capacitor C1 and the threshold value Va are corrected.

FIG. 18 is a flow chart illustrating the process procedure of a deterioration detecting process on the insulating resistors Rp and Rn which is performed in a deterioration detecting apparatus 23 according to the modification of the second embodiment. The processes of STEPS S401 to S405 of FIG. 18 substantially correspond to the processes of STEPS S301 to S305 of FIG. 5, and thus will not be described.

In a case where the voltage VR is equal to or greater than the threshold value Va, the deterioration detecting unit 26e according to the modification proceeds to STEP S405. Then, if it is determined that a deterioration in the capacitor C1 has not been detected ("Yes" in STEP S405), in STEP S406, the deterioration detecting unit performs a correction process according to the deterioration states of elements such as the capacitor C1 positioned on the charging path.

Specifically, the deterioration detecting unit 26e performs the correction process as in STEP S6 or STEP S17 described above, that is, correction on the voltage VR, correction on the threshold value Va and the like, using the correction coefficient.

Now, a case of correcting the detected voltage VR on the basis of the correction coefficient will be described as an example. However, the present invention is not limited thereto. The threshold value Va or the like may be corrected. Also, the concrete content of the correction process of STEP S406 is the same as that of STEP S6 or STEP S17 described above. However, the content of the correction process is not limited thereto. Any other correction method may be used.

Subsequently, in STEP S407, the deterioration detecting unit 26e re-determines whether the corrected voltage VR is equal to or greater than the threshold value Vs. In a case where the corrected voltage VR is less than the threshold value Va ("No" in STEP S407), that is, in a case where the result obtained by correcting the voltage VR in view of the deterioration state of the capacitor C1 is less than the threshold value Va, in STEP S404, the deterioration detecting unit 26e determines that there is no deterioration in the insulating resistor Rp or Rn.

As described above, the deterioration detecting unit 26e does not erroneously determine a state where the voltage VR has become equal to or greater than the threshold value Va due to a deterioration in the capacitor C1 or the like, as a state where there is a deterioration in the insulating resistor Rp or Rn, and thus can accurately detect a deterioration in the insulating resistor Rp or Rn.

Meanwhile, in a case where the corrected voltage VR is equal to or greater than the threshold value Va ("Yes" in STEP S407), that is, in a case where the corrected voltage VR is also equal to or greater than the threshold value Va, in STEP S408, the deterioration detecting unit 26e detects a deterioration in the insulating resistor Rp or Rn. Also, even in a case where it is determined that a deterioration in the capacitor C1 has not been detected ("No" in STEP S405), in STEP S408, the deterioration detecting unit 26e detects a deterioration in the insulating resistor Rp or Rn.

Also, in the above description, in detection on a deterioration in the insulating resistors Rp and Rn according to the first embodiment, each of the voltage VRp and the voltage VRn of the capacitor C1 is compared with the threshold value Va. However, the present invention is not limited thereto. For example, a deterioration in the insulating resistor Rp or Rn may be detected by adding the voltage VRp and the voltage VRn and comparing the obtained voltage with another predetermined threshold value Also, detection on a deterioration in the insulating resistor Rp or Rn according to the first embodiment is the same as the second embodiment in that any one of the voltage VRp and the voltage VRn of the capacitor C1 and the voltage (VRp+VRn) can be used.

Also, in the second embodiment, on the basis of the voltages V1 and V2 of the capacitor C1 which is charged and discharged in order to detect the first and second stack voltages, the discharge rate D is calculated. However, the present invention is not limited thereto. For example, on the basis of the voltage VRn or VRp of the capacitor C1 charged in order to detect a deterioration in the insulating resistor Rp or Rn, and the voltage of the capacitor C1 discharged for the predetermined time after the charging, the discharge rate D may be calculated.

Also, the timing of the deterioration detecting processes in the first or second embodiment is not limited to the above described timing. For example, each deterioration detecting process may be performed at the timing of starting of the vehicle or the timing of stopping of the vehicle, or may be performed at intervals of a predetermined time or at the intervals of a predetermined traveling distance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A deterioration detecting apparatus comprising:
a capacitor that is connected to an insulated electric power source, and is charged and discharged;
a voltage detecting unit that detects a voltage of the capacitor; and
a deterioration detecting unit that detects a deterioration in an insulating resistor of the electric power source on the basis of the voltage of the capacitor charged through a charging path for detecting the deterioration in the insulating resistor of the electric power source, and the voltage of the capacitor during discharging, wherein the deterioration detecting unit:
includes a discharge rate calculating unit that calculates a discharge rate of the capacitor on the basis of the voltage of the capacitor charged, and the voltage of the capacitor discharged for a predetermined time after charging of the capacitor;
detects the deterioration in the insulating resistor of the electric power source on the basis of the voltage of the charged capacitor and the discharge rate; and
in a case where the voltage of the charged capacitor is equal to or greater than a predetermined threshold value, and the discharge rate is within a predetermined range, the deterioration detecting unit detects the deterioration in the insulating resistor of the electric power source.

2. The deterioration detecting apparatus according to claim 1, wherein:
in a case where the voltage of the charged capacitor is less than a predetermined threshold value, and the discharge rate is out of the predetermined range, the deterioration detecting unit detects a deterioration in elements including the capacitor positioned on a discharging path, and determines that there is no deterioration in the insulating resistor of the electric power source.

3. The deterioration detecting apparatus according to claim 1, wherein:
in a case where the voltage of the charged capacitor is equal to or greater than a predetermined threshold value, and the discharge rate is out of a predetermined range, the deterioration detecting unit:
corrects the voltage of the capacitor detected by the voltage detecting unit, or the threshold value, and
uses the corrected capacitor voltage or the corrected threshold value to detect the deterioration in the insulating resistor of the electric power source.

4. A deterioration detecting apparatus comprising:
a capacitor that is connected to an insulated electric power source, and is charged and discharged;
a voltage detecting unit that detects a voltage of the capacitor; and
a deterioration detecting unit that detects a deterioration in an insulating resistor of the electric power source on the basis of the voltage of the capacitor charged through a charging path for detecting the deterioration in the insulating resistor of the electric power source, and the voltage of the capacitor during discharging, wherein the deterioration detecting unit:
includes a discharge rate calculating unit that calculates a discharge rate of the capacitor on the basis of the voltage of the capacitor charged, and the voltage of the capacitor discharged for a predetermined time after charging of the capacitor;
detects the deterioration in the insulating resistor of the electric power source on the basis of the voltage of the charged capacitor and the discharge rate; and
in a case where the voltage of the charged capacitor is equal to or greater than a predetermined threshold value, and the discharge rate is out of a predetermined range, the deterioration detecting unit:
corrects the voltage of the capacitor detected by the voltage detecting unit, or the threshold value, and
uses the corrected capacitor voltage or the corrected threshold value to detect the deterioration in the insulating resistor of the electric power source.

5. A deterioration detecting method comprising:
detecting a voltage of a capacitor which is connected to an insulated electric power source and is charged and discharged;
calculating a discharge rate of the capacitor on the basis of the voltage of the capacitor charged, and the voltage of the capacitor discharged for a predetermined time after charging of the capacitor; and
detecting a deterioration in an insulating resistor of the electric power source on the basis of the voltage of the capacitor charged through a charging path for detecting the deterioration in the insulating resistor of the electric power source, and the voltage of the capacitor during discharging, wherein
in the detecting, the deterioration in the insulating resistor of the electric power source is detected on the basis of the voltage of the charged capacitor and the discharge rate, and
in a case where the voltage of the charged capacitor is equal to or greater than a predetermined threshold value, and the discharge rate is within a predetermined range, the deterioration in the insulating resistor of the electric power source is detected in the detecting.

\* \* \* \* \*